United States Patent
Takami

(10) Patent No.: US 12,451,856 B2
(45) Date of Patent: Oct. 21, 2025

(54) BRANCHING FILTER

(71) Applicant: TDK CORPORATION, Tokyo (JP)

(72) Inventor: Toshiyuki Takami, Tokyo (JP)

(73) Assignee: TDK CORPORATION, Tokyo (JP)

( * ) Notice: Subject to any disclaimer, the term of this patent is extended or adjusted under 35 U.S.C. 154(b) by 155 days.

(21) Appl. No.: 18/484,711

(22) Filed: Oct. 11, 2023

(65) Prior Publication Data

US 2024/0128943 A1   Apr. 18, 2024

(30) Foreign Application Priority Data

Oct. 18, 2022   (JP) .................. 2022-167047

(51) Int. Cl.
*H03H 7/01* (2006.01)
*H03H 7/46* (2006.01)

(52) U.S. Cl.
CPC .......... *H03H 7/0115* (2013.01); *H03H 7/461* (2013.01); *H03H 7/463* (2013.01)

(58) Field of Classification Search
CPC ....... H03H 7/0115; H03H 7/463; H03H 7/461

USPC .......................... 333/100, 126, 129, 132, 175
See application file for complete search history.

(56) References Cited

U.S. PATENT DOCUMENTS

| | | | |
|---|---|---|---|
| 8,026,775 B2 * | 9/2011 | Meharry | H03F 3/211 |
| | | | 333/132 |
| 2005/0206475 A1 | 9/2005 | Strull et al. | |
| 2010/0157858 A1 * | 6/2010 | Lee | H04B 1/0057 |
| | | | 343/904 |
| 2018/0041190 A1 | 2/2018 | Yoshimura et al. | |
| 2018/0269846 A1 * | 9/2018 | Mizoguchi | H03H 7/0115 |

* cited by examiner

*Primary Examiner* — Rakesh B Patel
(74) *Attorney, Agent, or Firm* — Oliff PLC

(57) ABSTRACT

A branching filter includes a first diplexer, a second diplexer, and a third diplexer. An input end of the first diplexer is connected to an input port. An input end of the second diplexer and an input end of the third diplexer are connected to two output ends of the first diplexer, respectively. Two output ends of the second diplexer are connected to first and second output ports, respectively. Two output ends of the third diplexer are connected to third and fourth output ports, respectively.

9 Claims, 19 Drawing Sheets

BRANCHING FILTER

CROSS REFERENCE TO RELATED APPLICATIONS

This application claims the benefit of Japanese Priority Patent Application No. 2022-167047 filed on Oct. 18, 2022, the entire contents of which are incorporated herein by reference.

BACKGROUND OF THE INVENTION

1. Field of the Invention

The present invention relates to a branching filter configured to separate at least four signals.

2. Description of the Related Art

Compact mobile communication apparatuses are generally configured to use a single common antenna for a plurality of applications that use different systems and have different service frequency bands, and to use a branching filter to separate a plurality of signals received and transmitted by the antenna from each other.

A branching filter for separating a first signal of a frequency within a first frequency band and a second signal of a frequency within a second frequency band higher than the first frequency band from each other typically includes a common port, a first signal port, a second signal port, a first filter provided in a first signal path leading from the common port to the first signal port, and a second filter provided in a second signal path leading from the common port to the second signal port. As the first and second filters, LC resonators including inductors and capacitors are used, for example.

A recent trend of compact mobile communication apparatuses toward increased service frequency bands with adoption of new communication standards has required an increase of the number of signals for a branching filter to separate. For example, US 2018/0041190 A1 discloses a triplexer that separates three signals, a quadplexer that separates four signals, a pentaplexer that separates five signals, and the like.

Especially when the number of signals to separate is four or more, the number of elements necessary for a branching filter increases. An increase of the number of elements provided on a signal path from a common port to a specific signal port causes a problem that insertion loss in the passband of a filter provided between the common port and the specific signal port degrades.

SUMMARY OF THE INVENTION

An objective of the present invention is to provide a branching filter configured to separate four signals and capable of reducing insertion loss of a passband.

A branching filter of the present invention includes:
an input port;
a first output port;
a second output port;
a third output port;
a fourth output port;
a first diplexer including a first input end connected to the input port, a first output end, and a second output end;
a second diplexer including a second input end connected to the first output end, a third output end directly connected to the first output port, and a fourth output end directly connected to the second output port; and
a third diplexer including a third input end connected to the second output end, a fifth output end directly connected to the third output port, and a sixth output end directly connected to the fourth output port.

The branching filter of the present invention includes the first to third diplexers connected as described above. Thus, according to the present invention, it is possible to reduce insertion loss of a passband.

Other and further objects, features and advantages of the present invention will appear more fully from the following description.

DETAILED DESCRIPTION OF THE PREFERRED EMBODIMENTS

Figure 1:
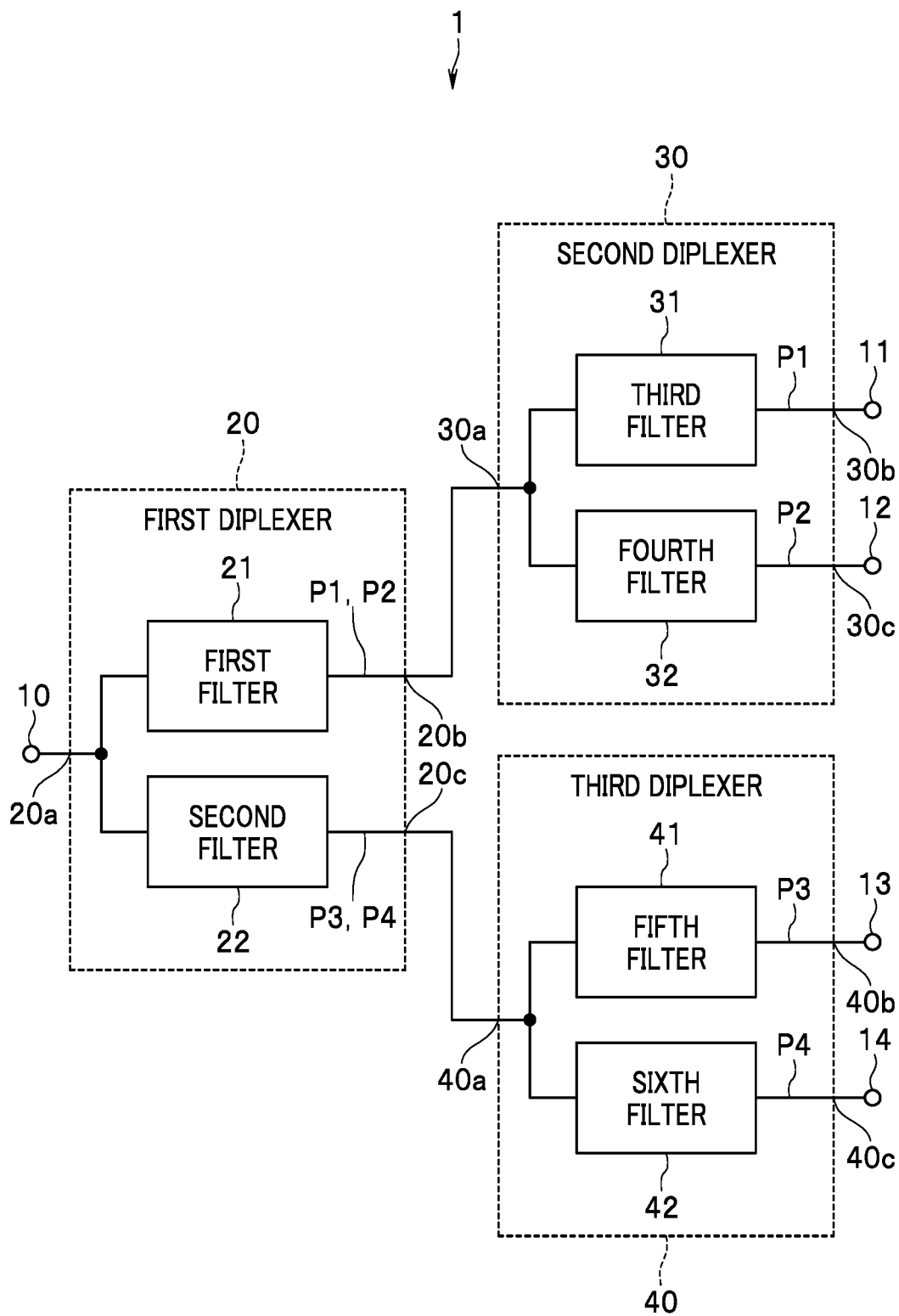
FIG. 1 is a block diagram showing a configuration of a branching filter according to an embodiment of the present invention.

An embodiment of the present invention will now be described in detail with reference to the drawings. First, a configuration of a branching filter 1 according to the embodiment of the present invention will be outlined with reference to FIG. 1. FIG. 1 is a block diagram showing a configuration of the branching filter 1.

The branching filter 1 includes an input port 10, a first output port 11, a second output port 12, a third output port 13, and a fourth output port 14. The first output port 11 is a port configured to selectively pass a signal of a frequency within a first passband. The second output port 12 is a port configured to selectively pass a signal of a frequency within a second passband. The third output port 13 is a port configured to selectively pass a signal of a frequency within a third passband. The fourth output port 14 is a port configured to selectively pass a signal of a frequency within a fourth passband.

The second passband is a frequency band higher than the first passband. The fourth passband is a frequency band higher than the third passband. The third passband may be a frequency band higher than the second passband. Alternatively, the fourth passband may be a frequency band lower than the first passband. In this case, the third passband is also a frequency band lower than the first passband. In the following description, the third passband is assumed as a frequency band higher than the second passband.

The branching filter 1 further includes a first diplexer 20, a second diplexer 30, and a third diplexer 40. The first diplexer 20 includes an input end 20a and two output ends 20b and 20c. The input end 20a of the first diplexer 20 is connected to the input port 10.

The second diplexer 30 includes an input end 30a and two output ends 30b and 30c. The second diplexer 30 is provided between the output end 20b of the first diplexer 20 and the first and second output ports 11 and 12 in circuit configuration. The input end 30a of the second diplexer 30 is connected to the output end 20b of the first diplexer 20. The output end 30b of the second diplexer 30 is directly connected to the first output port 11. The output end 30c of the second diplexer 30 is directly connected to the second output port 12.

The third diplexer 40 includes an input end 40a and two output ends 40b and 40c. The third diplexer 40 is provided between the output end 20c of the first diplexer 20 and the third and fourth output ports 13 and 14 in circuit configuration. The input end 40a of the third diplexer 40 is connected to the output end 20c of the first diplexer 20. The output end 40b of the third diplexer 40 is directly connected to the third output port 13. The output end 40c of the third diplexer 40 is directly connected to the fourth output port 14.

Note that in the present application, the expression "in circuit configuration" is used to indicate arrangement in a circuit diagram, but not arrangement in physical configuration. The expression "directly connected" means that no other filter is provided between an output end of a diplexer and an output port connected to each other.

The first diplexer 20 is configured to selectively pass a signal of a frequency band including the second passband but not including the third passband through the output end 20b and selectively pass a signal of a frequency band including the third passband but not including the second passband through the output end 20c. In the present embodiment, in particular, the first diplexer 20 includes a first filter 21 provided between the input end 20a and the output end 20b in circuit configuration and a second filter 22 provided between the input end 20a and the output end 20c in circuit configuration. The first filter 21 is a filter configured to selectively pass a signal of a frequency band including the first passband and the second passband but not including the third passband. The second filter 22 is a filter configured to selectively pass a signal of a frequency band including the third passband and the fourth passband but not including the second passband.

The second diplexer 30 is configured to selectively pass a signal of a frequency within the first passband through the output end 30b and selectively pass a signal of a frequency within the second passband through the output end 30c. In the present embodiment, in particular, the second diplexer 30 includes a third filter 31 provided between the input end 30a and the output end 30b in circuit configuration and a fourth filter 32 provided between the input end 30a and the output end 30c in circuit configuration. The third filter 31 is a filter configured to selectively pass a signal of a frequency within the first passband. The fourth filter 32 is a filter configured to selectively pass a signal of a frequency within the second passband.

The third diplexer 40 is configured to selectively pass a signal of a frequency within the third passband through the output end 40b and selectively pass a signal of a frequency within the fourth passband through the output end 40c. In the present embodiment, in particular, the third diplexer 40 includes a fifth filter 41 provided between the input end 40a and the output end 40b in circuit configuration and a sixth filter 42 provided between the input end 40a and the output end 40c in circuit configuration. The fifth filter 41 is a filter configured to selectively pass a signal of a frequency within the third passband. The sixth filter 42 is a filter configured to selectively pass a signal of a frequency within the fourth passband.

The branching filter 1 further includes a first path P1 connecting the input port 10 and the first output port 11, a second path P2 connecting the input port 10 and the second output port 12, a third path P3 connecting the input port 10 and the third output port 13, and a fourth path P4 connecting the input port 10 and the fourth output port 14. The first and second paths P1 and P2 are common paths from the input end 20a of the first diplexer 20 to the input end 30a of the second diplexer 30. The third and fourth paths P3 and P4 are common paths from the input end 20a of the first diplexer 20 to the input end 40a of the third diplexer 40.

The first filter 21 is provided on a path connecting the input end 20a and the output end 20b of the first diplexer 20 and constituting part of each of the first and second paths P1 and P2. The second filter 22 is provided on a path connecting the input end 20a and the output end 20c of the first diplexer 20 and constituting part of each of the third and fourth paths P3 and P4.

The third and fourth filters 31 and 32 are provided at a subsequent stage of the first filter 21. The first and second paths P1 and P2 branch at the subsequent stage of the first filter 21. The third filter 31 is provided on the first path P1. The fourth filter 32 is provided on the second path P2.

The fifth and sixth filters 41 and 42 are provided at a subsequent stage of the second filter 22. The third and fourth paths P3 and P4 branch at the subsequent stage of the second filter 22. The fifth filter 41 is provided on the third path P3. The sixth filter 42 is provided on the fourth path P4.

A first signal of a frequency within the first passband input to the input port 10 selectively passes the first path P1, specifically, the first and third filters 21 and 31, and is output from the first output port 11. A second signal of a frequency within the second passband input to the input port 10 selectively passes the second path P2, specifically, the first and fourth filters 21 and 32, and is output from the second output port 12. A third signal of a frequency within the third passband input to the input port 10 selectively passes the third path P3, specifically, the second and fifth filters 22 and 41, and is output from the third output port 13. A fourth signal of a frequency within the fourth passband input to the input port 10 selectively passes the fourth path P4, specifically, the second and sixth filters 22 and 42, and is output from the fourth output port 14. In such a manner, the branching filter 1 separates the first to fourth signals.

Figure 2:
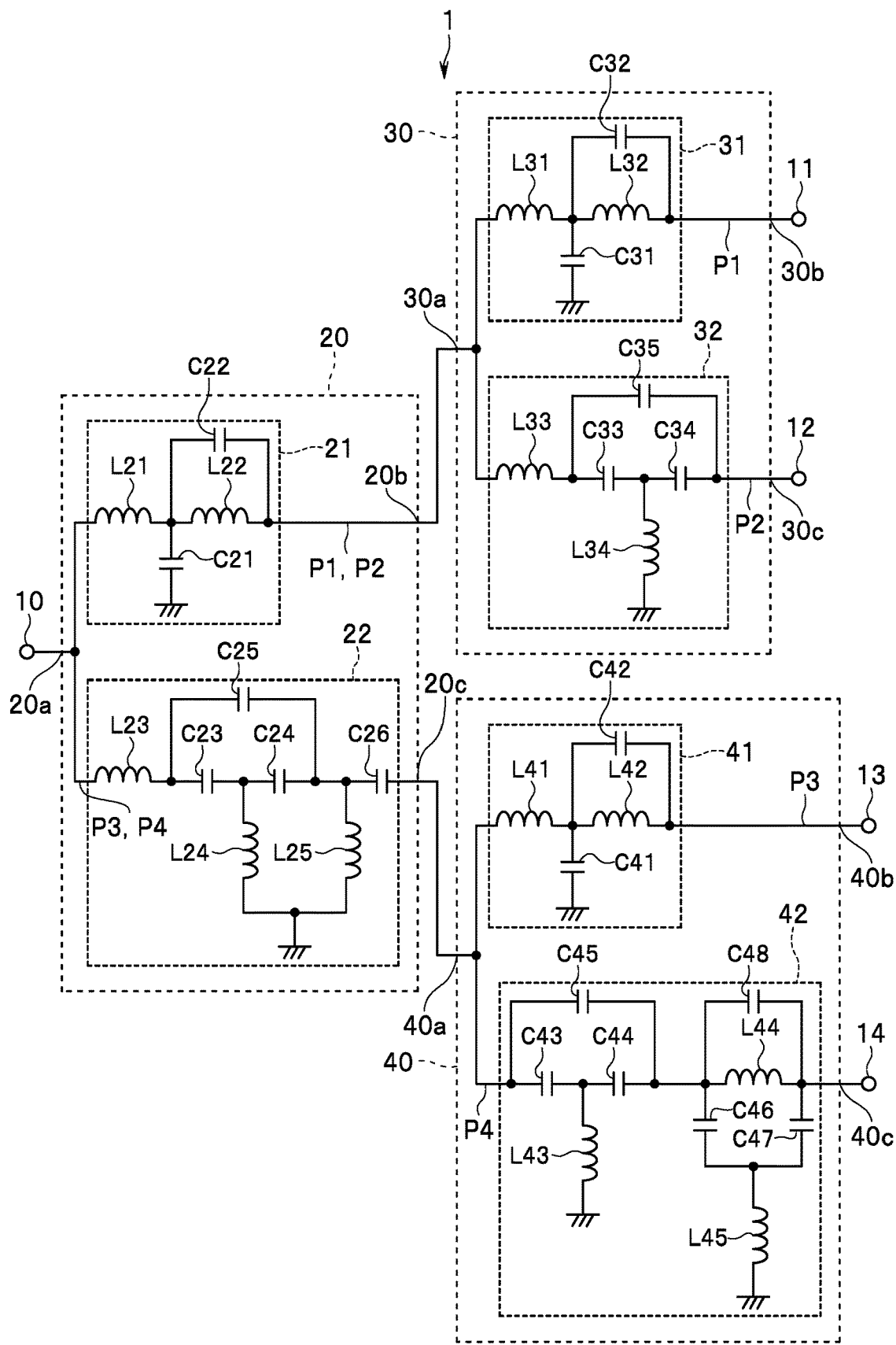
FIG. 2 is a circuit diagram showing an example of a circuit configuration of the branching filter according to the embodiment of the present invention.

Next, an example of a circuit configuration of the branching filter 1 will be described with reference to FIG. 2. FIG. 2 is a circuit diagram showing an example of the circuit configuration of the branching filter 1.

First, a configuration of the first diplexer 20 will be described. The first filter 21 of the first diplexer 20 includes inductors L21 and L22 and capacitors C21 and C22. One end of the inductor L21 is connected to the input end 20a of the first diplexer 20. One end of the inductor L22 is connected to the other end of the inductor L21. The other end of the inductor L22 is connected to the output end 20b of the first diplexer 20.

One end of the capacitor C21 is connected to a connection point between the inductors L21 and L22. The other end of the capacitor C21 is connected to the ground. The capacitor C22 is connected in parallel with the inductor L22.

The second filter 22 of the first diplexer 20 includes inductors L23, L24, and L25 and capacitors C23, C24, C25, and C26. One end of the inductor L23 is connected to the input end 20a of the first diplexer 20.

One end of the capacitor C23 is connected to the other end of the inductor L23. One end of the capacitor C24 is connected to the other end of the capacitor C23. One end of the capacitor C25 is connected to the one end of the capacitor C23. The other end of the capacitor C25 and one end of the capacitor C26 are connected to the other end of the capacitor C24. The other end of the capacitor C26 is connected to the output end 20c of the first diplexer 20.

One end of the inductor L24 is connected to a connection point between the capacitor C23 and the capacitor C24. One end of the inductor L25 is connected to a connection point between the capacitor C24 and the capacitor C25. The other end of each of the inductors L24 and L25 is connected to the ground.

Next, a configuration of the second diplexer 30 will be described. The third filter 31 of the second diplexer 30 includes inductors L31 and L32 and capacitors C31 and C32. One end of the inductor L31 is connected to the input end 30a of the second diplexer 30. One end of the inductor L32 is connected to the other end of the inductor L31. The other end of the inductor L32 is connected to the output end 30b of the second diplexer 30.

One end of the capacitor C31 is connected to a connection point between the inductors L31 and L32. The other end of the capacitor C31 is connected to the ground. The capacitor C32 is connected in parallel with the inductor L32.

The fourth filter 32 of the second diplexer 30 includes inductors L33 and L34 and capacitors C33, C34, and C35. One end of the inductor L33 is connected to the input end 30a of the second diplexer 30.

One end of the capacitor C33 is connected to the other end of the inductor L33. One end of the capacitor C34 is connected to the other end of the capacitor C33. The other end of the capacitor C34 is connected to the output end 30c of the second diplexer 30. One end of the capacitor C35 is connected to the one end of the capacitor C33. The other end of the capacitor C35 is connected to the other end of the capacitor C34.

One end of the inductor L34 is connected to a connection point between the capacitor C33 and the capacitor C34. The other end of the inductor L34 is connected to the ground.

Next, a configuration of the third diplexer 40 will be described. The fifth filter 41 of the third diplexer 40 includes inductors L41 and L42 and capacitors C41 and C42. One end of the inductor L41 is connected to the input end 40a of the third diplexer 40. One end of the inductor L42 is connected to the other end of the inductor L41. The other end of the inductor L42 is connected to the output end 40b of the third diplexer 40.

One end of the capacitor C41 is connected to a connection point between the inductors L41 and L42. The other end of the capacitor C41 is connected to the ground. The capacitor C42 is connected in parallel with the inductor L42.

The sixth filter 42 of the third diplexer 40 includes inductors L43, L44, and L45 and capacitors C43, C44, C45, C46, C47, and C48. One end of the capacitor C43 is connected to the input end 40a of the third diplexer 40. One end of the capacitor C44 is connected to the other end of the capacitor C43. One end of the capacitor C45 is connected to the one end of the capacitor C43. The other end of the capacitor C45 is connected to the other end of the capacitor C44.

One end of the inductor L43 is connected to a connection point between the capacitor C43 and the capacitor C44. The other end of the inductor L43 is connected to the ground.

One end of the inductor L44 is connected to the other end of the capacitor C44. The other end of the inductor L44 is connected to the output end 40c of the third diplexer 40.

One end of the capacitor C46 and one end of the capacitor C48 are connected to the one end of the inductor L44. One end of the capacitor C47 and the other end of the capacitor C48 are connected to the other end of the inductor L44.

One end of the inductor L45 is connected to the other end of each of the capacitors C46 and C47. The other end of the inductor L45 is connected to the ground.

Figure 3:
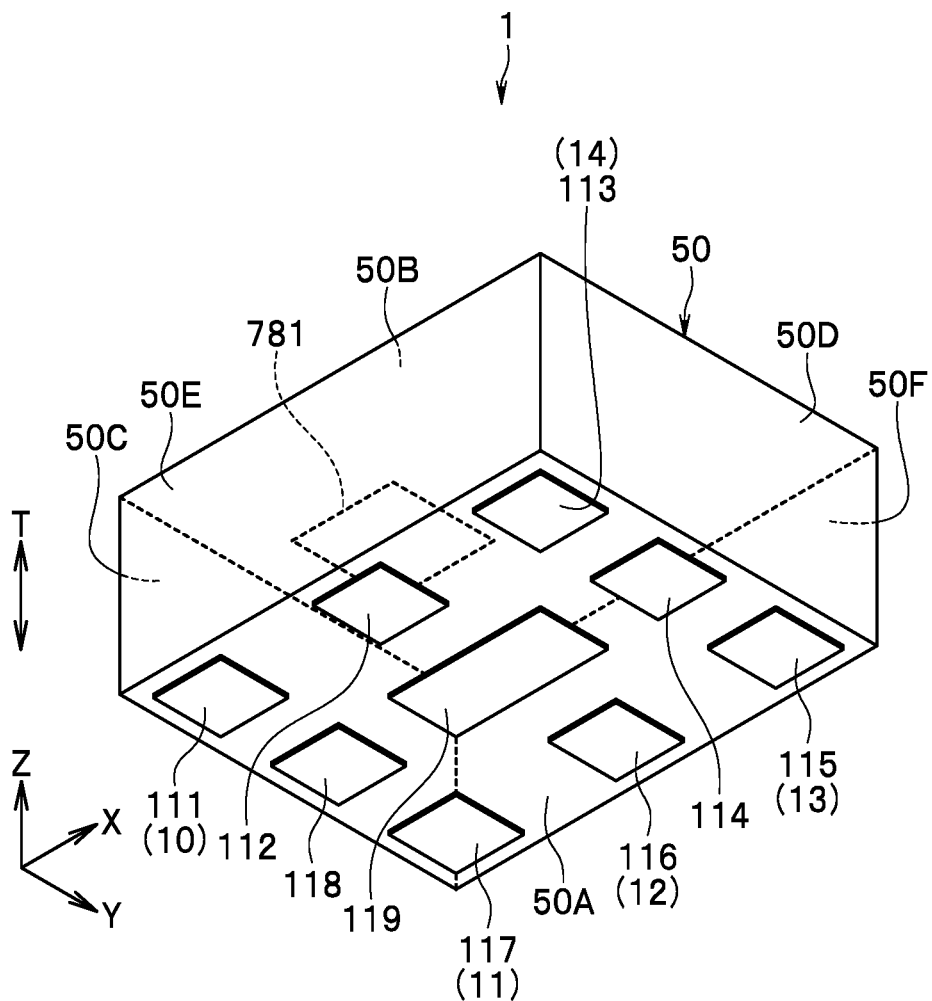
FIG. 3 is a perspective view showing an appearance of the branching filter according to the embodiment of the invention.

Next, other configurations of the branching filter 1 will be described with reference to FIG. 3. FIG. 3 is a perspective view showing an appearance of the branching filter 1.

The branching filter 1 further includes a stack 50 including a plurality of dielectric layers and a plurality of conductors stacked together. The stack 50 is intended to integrate the input port 10, the first to fourth output ports 11 to 14, and the first to third diplexers 20, 30, and 40. The first to third diplexers 20, 30, and 40 are each constituted by using a plurality of conductors.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other, and the side surfaces 50E and 50F are also opposite to each other. The side surfaces 50C to 50F are perpendicular to the top surface 50B and the bottom surface 50A.

Here, X, Y, and Z directions are defined as shown in FIG. 3. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively. The expression "when viewed in the stacking direction T" means that an object is viewed from a position away in the Z direction or the −Z direction.

As shown in FIG. 3, the bottom surface 50A is located at the end of the stack 50 in the −Z direction. The top surface 50B is located at the end of the stack 50 in the Z direction. The side surface 50C is located at the end of the stack 50 in the −X direction. The side surface 50D is located at the end of the stack 50 in the X direction. The side surface 50E is located at the end of the stack 50 in the —Y direction. The side surface 50F is located at the end of the stack 50 in the Y direction.

The branching filter 1 further includes an input terminal 111, output terminals 113, 115, 116, and 117, and ground terminals 112, 114, 118, and 119 connected to the ground. The input terminal 111, the output terminals 113, 115, 116, and 117, and the ground terminals 112, 114, 118, and 119 are provided on the bottom surface 50A of the stack 50.

The input terminal 111 is arranged near a corner at a position where the bottom surface 50A, the side surface 50C, and the side surface 50E intersect one another. The output terminal 113 is arranged near a corner at a position where the bottom surface 50A, the side surface 50D, and the side surface 50E intersect one another. The output terminal 115 is arranged near a corner at a position where the bottom surface 50A, the side surface 50D, and the side surface 50F intersect one another. The output terminal 117 is arranged near a corner at a position where the bottom surface 50A, the side surface 50C, and the side surface 50F intersect one another.

The ground terminal 112 is arranged between the input terminal 111 and the output terminal 113. The ground terminal 114 is arranged between the output terminal 113 and the output terminal 115. The output terminal 116 is arranged between the output terminal 115 and the output terminal 117. The ground terminal 118 is arranged between the input terminal 111 and the output terminal 117. The ground terminal 119 is arranged at a center of the bottom surface 50A.

The input terminal 111 corresponds to the input port 10, the output terminal 113 corresponds to the fourth output port 14, the output terminal 115 corresponds to the third output port 13, the output terminal 116 corresponds to the second output port 12, and the output terminal 117 corresponds to the first output port 11. Hence, the input port 10 and the first to fourth output ports 11 to 14 are provided on the bottom surface 50A of the stack 50.

Next, an example of the plurality of dielectric layers and the plurality of conductors constituting the stack 50 will be described with reference to FIG. 4A to FIG. 13. In this example, the stack 50 includes twenty-eight dielectric layers stacked together. The twenty-eight dielectric layers will be referred to as a first to a twenty-eighth dielectric layer in the order from bottom to top. The first to twenty-eighth dielectric layers are denoted by reference numerals 51 to 78, respectively.

In FIG. 4A to FIG. 12B, each circle represents a through hole. The dielectric layers 51 to 76 each have a plurality of through holes. The through holes are each formed by filling a hole intended for a through hole with a conductive paste. Each of the through holes is connected to a conductor layer or another through hole.

Figure 4A:
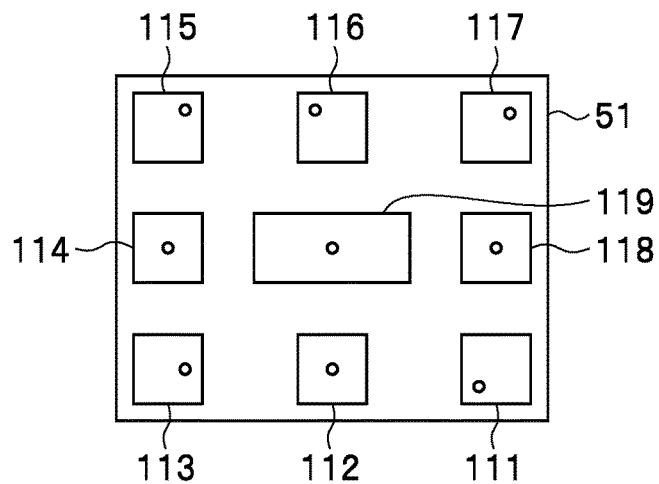
FIG. 4A to FIG. 4C are explanatory diagrams showing respective patterned surfaces of first to third dielectric layers of a stack of the branching filter according to the embodiment of the present invention.
Figure 4B:
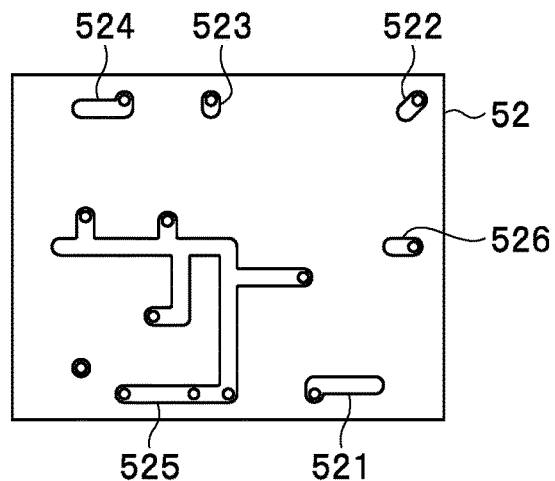

FIG. 4A shows a patterned surface of the first dielectric layer 51. The input terminal 111, the output terminals 113, 115, 116, and 117, and the ground terminals 112, 114, 118, and 119 are formed on the patterned surface of the dielectric layer 51. FIG. 4B shows a patterned surface of the second dielectric layer 52. Conductor layers 521, 522, 523, 524, 525, and 526 are formed on the patterned surface of the dielectric layer 52.

Figure 4C:
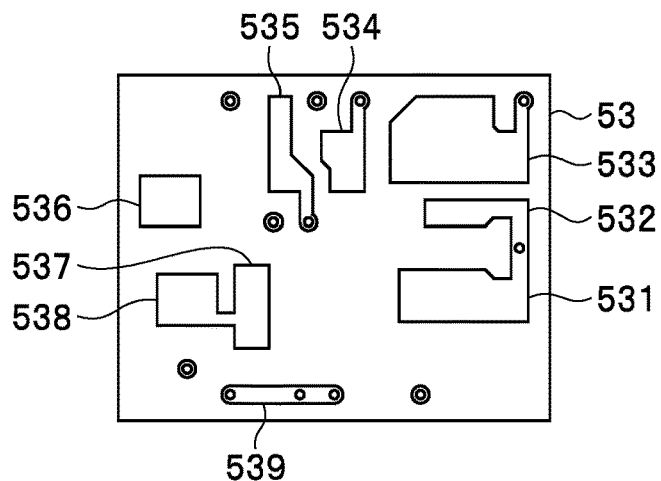

FIG. 4C shows a patterned surface of the third dielectric layer 53. Conductor layers 531, 532, 533, 534, 535, 536, 537, 538, and 539 are formed on the patterned surface of the dielectric layer 53. The conductor layer 532 is connected to the conductor layer 531. The conductor layer 538 is connected to the conductor layer 537.

Figure 5A:
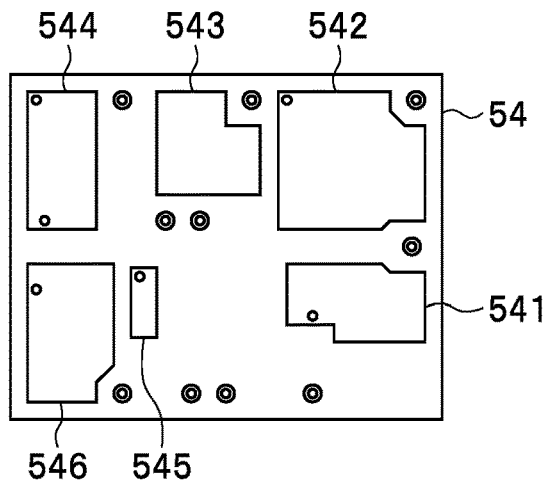
FIG. 5A to FIG. 5C are explanatory diagrams showing respective patterned surfaces of fourth to sixth dielectric layers of the stack of the branching filter according to the embodiment of the present invention.
Figure 5B:
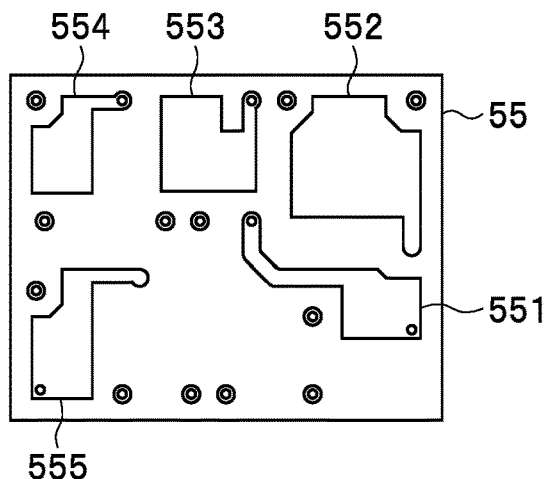
Figure 5C:
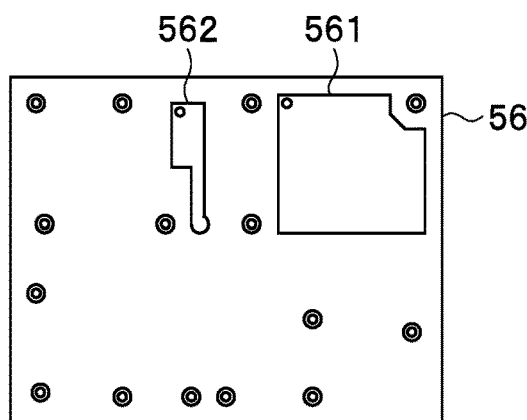

FIG. 5A shows a patterned surface of the fourth dielectric layer 54. Conductor layers 541, 542, 543, 544, 545, and 546 are formed on the patterned surface of the dielectric layer 54. FIG. 5B shows a patterned surface of the fifth dielectric layer 55. Conductor layers 551, 552, 553, 554, and 555 are formed on the patterned surface of the dielectric layer 55. FIG. 5C shows a patterned surface of the sixth dielectric layer 56. Conductor layers 561 and 562 are formed on the patterned surface of the dielectric layer 56.

Figure 6A:
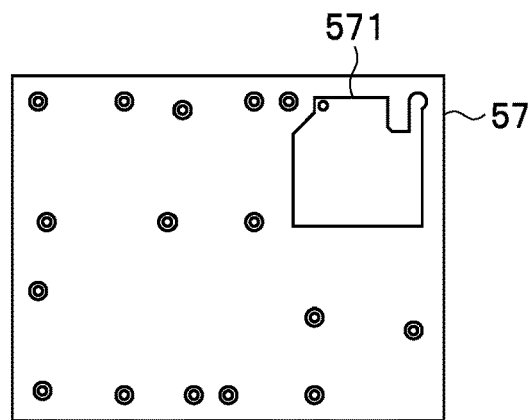
FIG. 6A to FIG. 6C are explanatory diagrams showing respective patterned surfaces of seventh to ninth dielectric layers of the stack of the branching filter according to the embodiment of the present invention.
Figure 6B:
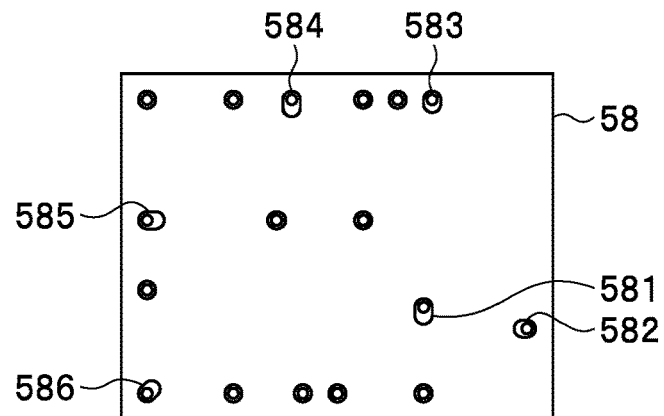
Figure 6C:
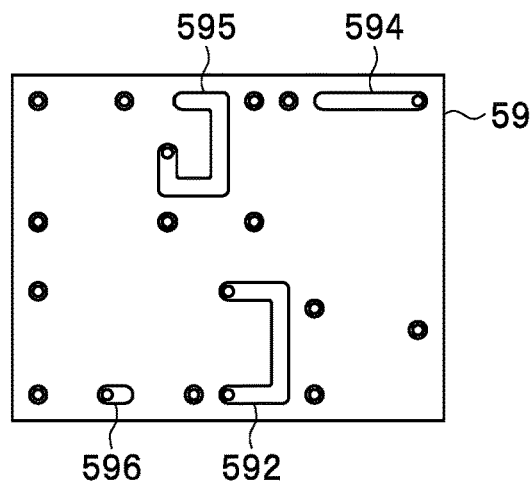

FIG. 6A shows a patterned surface of the seventh dielectric layer 57. A conductor layer 571 is formed on the patterned surface of the dielectric layer 57. FIG. 6B shows a patterned surface of the eighth dielectric layer 58. Conductor layers 581, 582, 583, 584, 585, and 586 are formed on the patterned surface of the dielectric layer 58. FIG. 6C shows a patterned surface of the ninth dielectric layer 59. Conductor layers 592, 594, 595, and 596 are formed on the patterned surface of the dielectric layer 59.

Figure 7A:
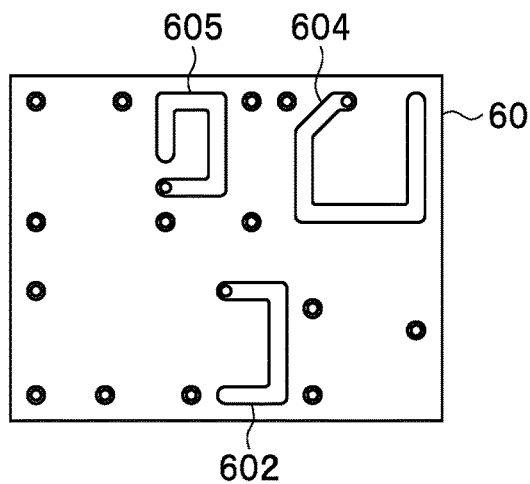
FIG. 7A to FIG. 7C are explanatory diagrams showing respective patterned surfaces of tenth to twelfth dielectric layers of the stack of the branching filter according to the embodiment of the present invention.
Figure 7B:
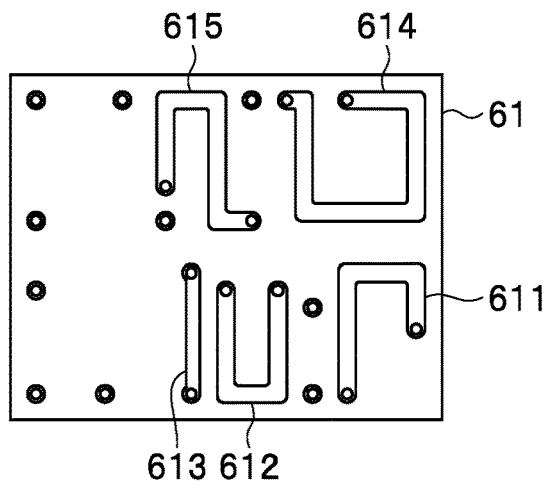
Figure 7C:
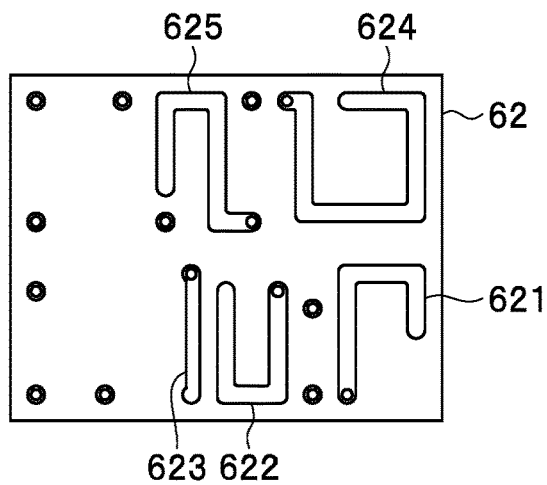

FIG. 7A shows a patterned surface of the tenth dielectric layer 60. Conductor layers 602, 604, and 605 are formed on the patterned surface of the dielectric layer 60. FIG. 7B shows a patterned surface of the eleventh dielectric layer 61. Conductor layers 611, 612, 613, 614, and 615 are formed on the patterned surface of the dielectric layer 61. FIG. 7C shows a patterned surface of the twelfth dielectric layer 62. Conductor layers 621, 622, 623, 624, and 625 are formed on the patterned surface of the dielectric layer 62.

Figure 8A:
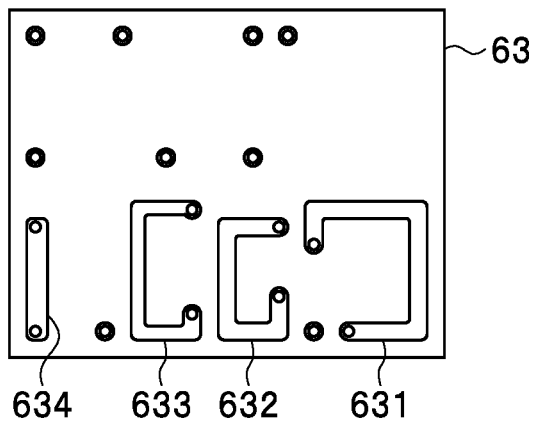
FIG. 8A to FIG. 8C are explanatory diagrams showing respective patterned surfaces of thirteenth to fifteenth dielectric layers of the stack of the branching filter according to the embodiment of the present invention.
Figure 8B:
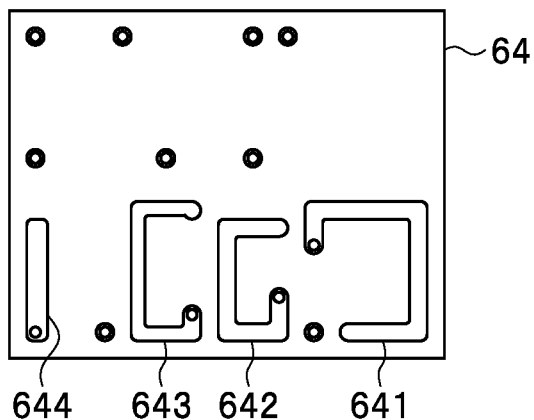
Figure 8C:
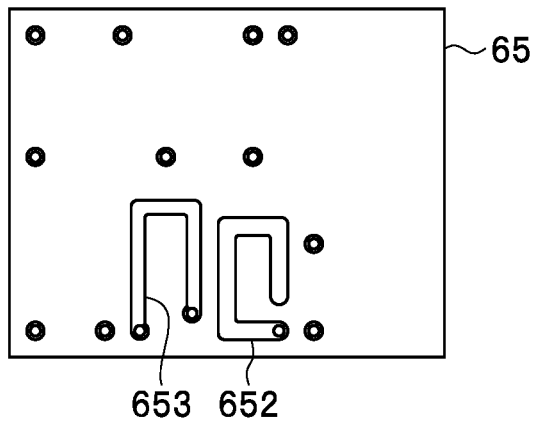

FIG. 8A shows a patterned surface of the thirteenth dielectric layer 63. Conductor layers 631, 632, 633, and 634 are formed on the patterned surface of the dielectric layer 63. FIG. 8B shows a patterned surface of the fourteenth dielectric layer 64. Conductor layers 641, 642, 643, and 644 are formed on the patterned surface of the dielectric layer 64. FIG. 8C shows a patterned surface of the fifteenth dielectric layer 65. Conductor layers 652 and 653 are formed on the patterned surface of the dielectric layer 65.

Figure 9A:
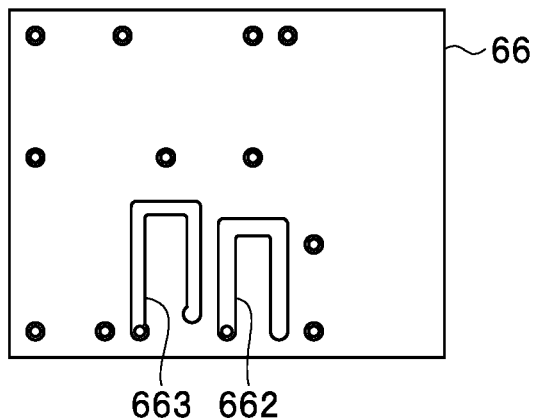
FIG. 9A to FIG. 9C are explanatory diagrams showing respective patterned surfaces of sixteenth to eighteenth dielectric layers of the stack of the branching filter according to the embodiment of the present invention.
Figure 9B:
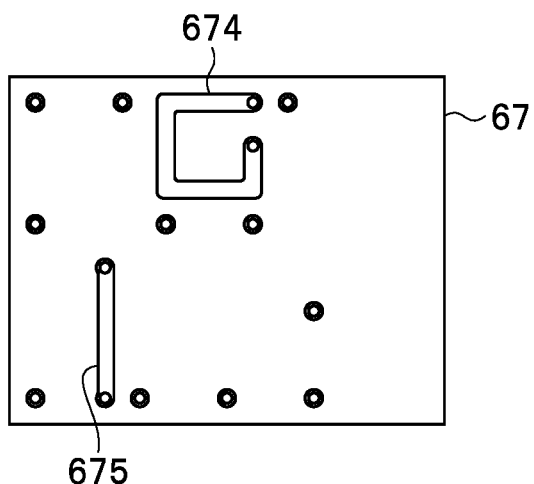
Figure 9C:
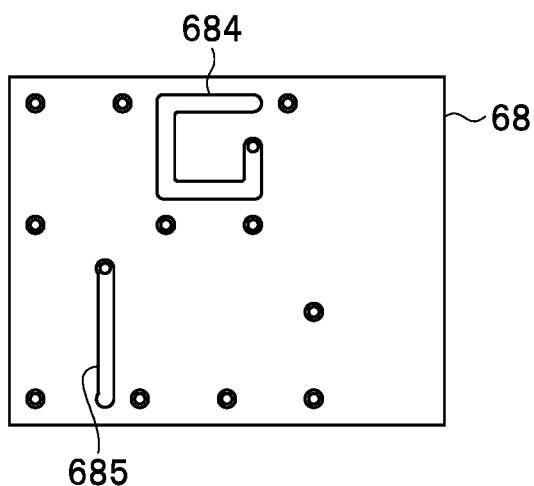

FIG. 9A shows a patterned surface of the sixteenth dielectric layer 66. Conductor layers 662 and 663 are formed on the patterned surface of the dielectric layer 66. FIG. 9B shows a patterned surface of the seventeenth dielectric layer 67. Conductor layers 674 and 675 are formed on the patterned surface of the dielectric layer 67. FIG. 9C shows a patterned surface of the eighteenth dielectric layer 68.

Conductor layers 684 and 685 are formed on the patterned surface of the dielectric layer 68.

Figure 10A:
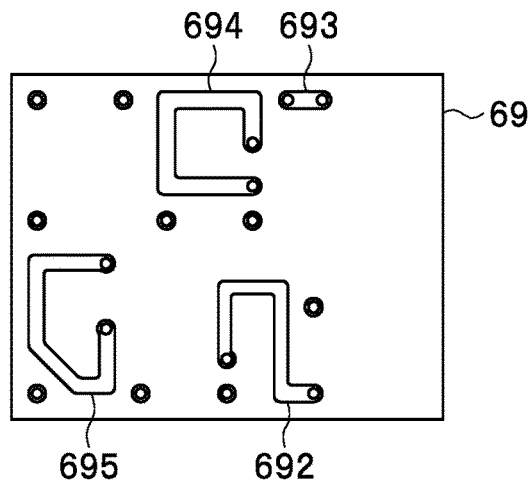
FIG. 10A to FIG. 10C are explanatory diagrams showing respective patterned surfaces of nineteenth to twenty-first dielectric layers of the stack of the branching filter according to the embodiment of the present invention.
Figure 10B:
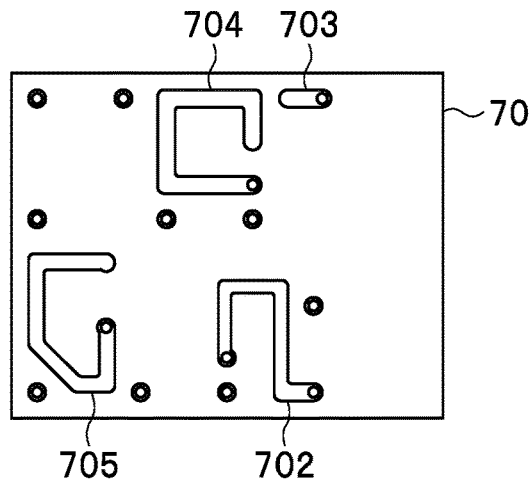
Figure 10C:
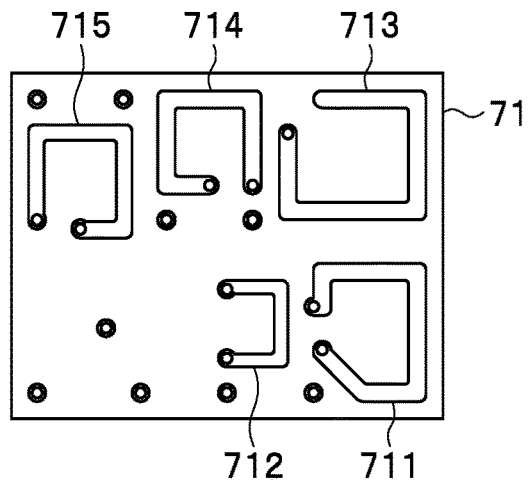

FIG. 10A shows a patterned surface of the nineteenth dielectric layer 69. Conductor layers 692, 693, 694, and 695 are formed on the patterned surface of the dielectric layer 69. FIG. 10B shows a patterned surface of the twentieth dielectric layer 70. Conductor layers 702, 703, 704, and 705 are formed on the patterned surface of the dielectric layer 70. FIG. 10C shows a patterned surface of the twenty-first dielectric layer 71. Conductor layers 711, 712, 713, 714, and 715 are formed on the patterned surface of the dielectric layer 71.

Figure 11A:
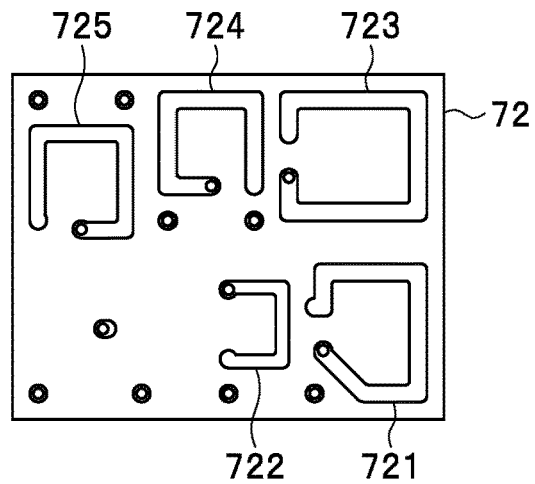
FIG. 11A to FIG. 11C are explanatory diagrams showing respective patterned surfaces of twenty-second to twenty-fourth dielectric layers of the stack of the branching filter according to the embodiment of the present invention.
Figure 11B:
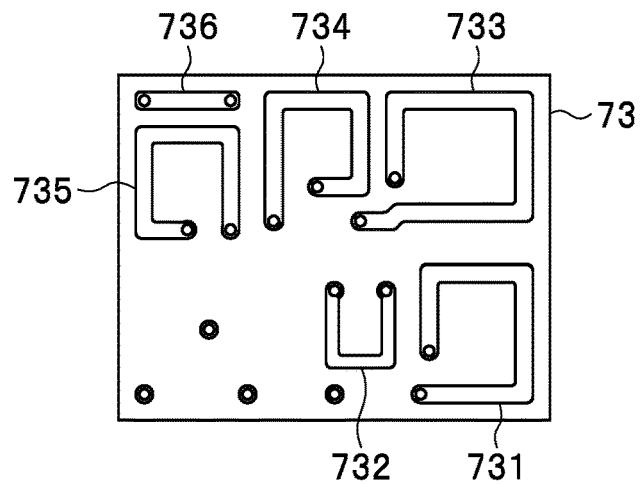
Figure 11C:
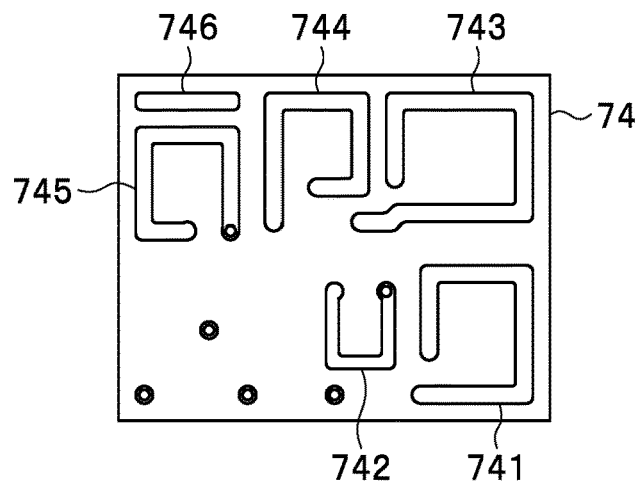

FIG. 11A shows a patterned surface of the twenty-second dielectric layer 72. Conductor layers 721, 722, 723, 724, and 725 are formed on the patterned surface of the dielectric layer 72. FIG. 11B shows a patterned surface of the twenty-third dielectric layer 73. Conductor layers 731, 732, 733, 734, 735, and 736 are formed on the patterned surface of the dielectric layer 73. FIG. 11C shows a patterned surface of the twenty-fourth dielectric layer 74. Conductor layers 741, 742, 743, 744, 745, and 746 are formed on the patterned surface of the dielectric layer 74.

Figure 12A:
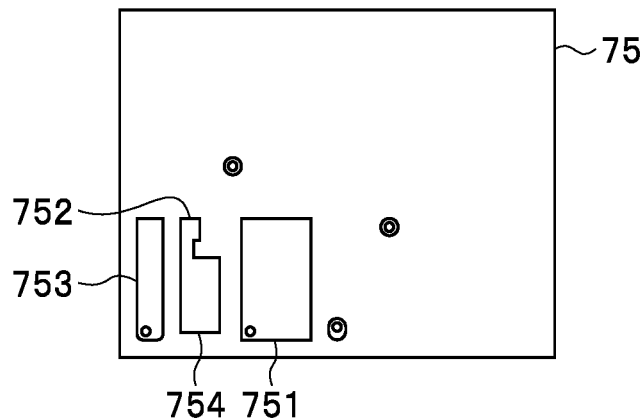
FIG. 12A to FIG. 12C are explanatory diagrams showing respective patterned surfaces of twenty-fifth to twenty-seventh dielectric layers of the stack of the branching filter according to the embodiment of the present invention.
Figure 12B:
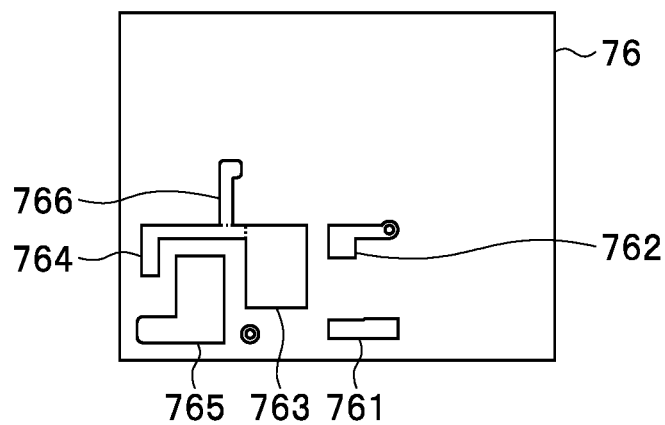
Figure 12C:
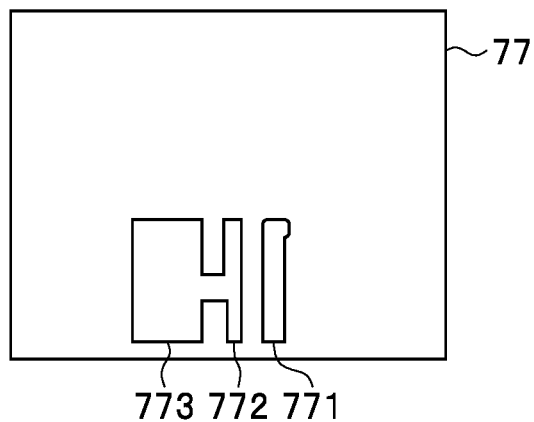

FIG. 12A shows a patterned surface of the twenty-fifth dielectric layer 75. Conductor layers 751, 752, 753, and 754 are formed on the patterned surface of the dielectric layer 75. The conductor layer 754 is connected to the conductor layer 752. FIG. 12B shows a patterned surface of the twenty-sixth dielectric layer 76. Conductor layers 761, 762, 763, 764, 765, and 766 are formed on the patterned surface of the dielectric layer 76. The conductor layer 764 is connected to the conductor layer 763. The conductor layer 766 is connected to the conductor layer 764. In FIG. 12B, the boundary between each two conductor layers is indicated by a dotted line. FIG. 12C shows a patterned surface of the twenty-seventh dielectric layer 77. Conductor layers 771, 772, and 773 are formed on the patterned surface of the dielectric layer 77. The conductor layer 773 is connected to the conductor layer 772.

Figure 13:
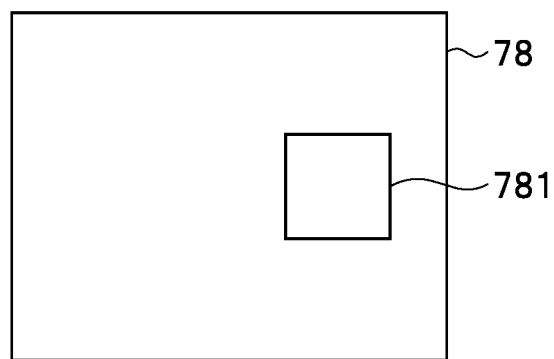
FIG. 13 is an explanatory diagram showing a patterned surface of a twenty-eighth dielectric layer of the stack of the branching filter according to the embodiment of the present invention.

FIG. 13 shows a patterned surface of the twenty-eighth dielectric layer 78. A mark 781 is formed on the patterned surface of the dielectric layer 78.

The stack 50 shown in FIG. 3 is formed by stacking the first to twenty-eighth dielectric layers 51 to 78 such that the patterned surface of the first dielectric layer 51 serves as the bottom surface 50A of the stack 50 and the surface of the twenty-eighth dielectric layer 78 opposite to the patterned surface thereof serves as the top surface 50B of the stack 50.

Each of the plurality of through holes shown in FIG. 4A to FIG. 12B is connected to a conductor layer overlapping in the stacking direction T when the first to twenty-seventh dielectric layers 51 to 77 are stacked, or to another through hole overlapping in the stacking direction T when the first to twenty-seventh dielectric layers 51 to 77 are stacked. Of the plurality of through holes shown in FIG. 4A to FIG. 12B, the ones located within a terminal or a conductor layer are connected to the terminal or conductor layer.

Figure 14:
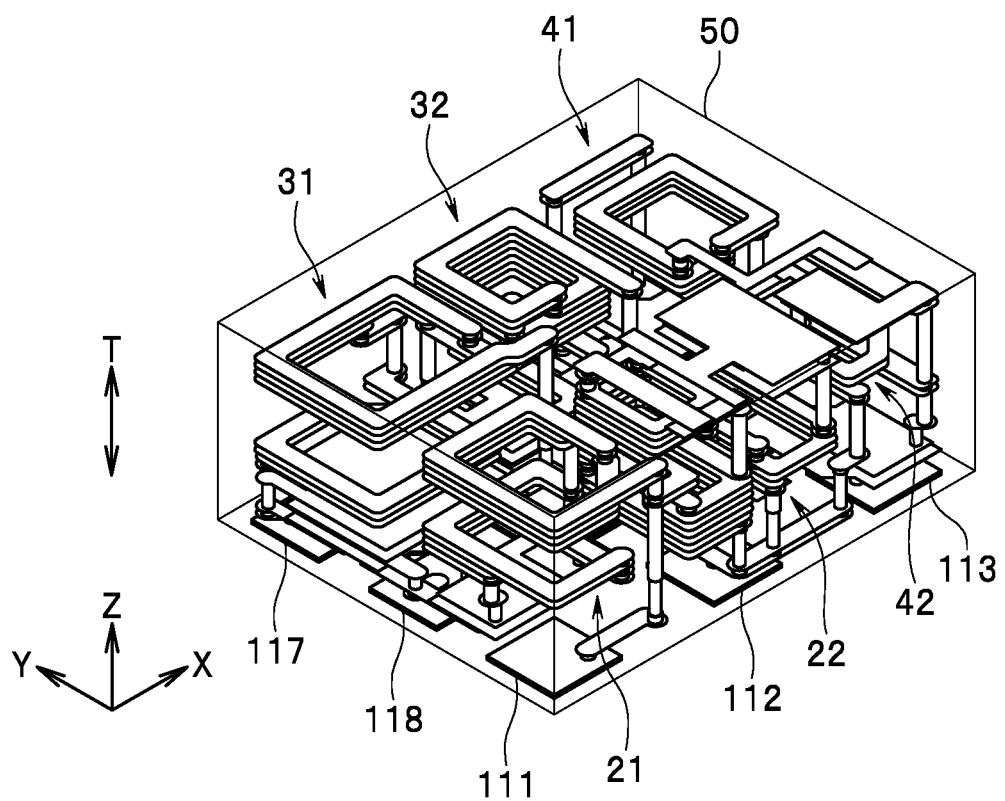
FIG. 14 is a perspective view showing an inside of the stack of the branching filter according to the embodiment of the present invention.

FIG. 14 shows an inside of the stack 50 formed by stacking the first to twenty-eighth dielectric layers 51 to 78. As shown in FIG. 14, the plurality of conductor layers and the plurality of through holes shown in FIG. 4A to FIG. 12C are stacked together inside the stack 50. In FIG. 14, the mark 781 is omitted.

For example, the stack 50 is fabricated by a low-temperature co-firing method, using ceramic as the material of the dielectric layers 51 to 78. In this case, a plurality of ceramic green sheets, which eventually become the dielectric layers 51 to 78, are fabricated first. Each ceramic green sheet has a plurality of unfired conductor layers formed thereon and a plurality of unfired through holes formed therein. The plurality of unfired conductor layers eventually become a plurality of conductor layers. The plurality of unfired through holes eventually become a plurality of through holes. Next, the plurality of ceramic green sheets are stacked together into a green sheet stack. The green sheet stack is then cut to form an unfired stack. The ceramic and conductor in the unfired stack are then fired by a low-temperature co-firing method to thereby complete the stack 50.

Correspondences between the components of the circuit of the branching filter 1 shown in FIG. 2 and the internal components of the stack 50 shown in FIG. 4B to FIG. 12C will now be described. First, components of the first filter 21 will be described. The inductor L21 is constituted by the conductor layers 711, 721, 731, and 741. The inductor L22 is constituted by the conductor layers 611, 621, 631, and 641.

The capacitor C21 is composed of the conductor layers 531 and 541 and the dielectric layer 53 interposed between those conductor layers. The capacitor C22 is composed of the conductor layers 541 and 551 and the dielectric layer 54 interposed between those conductor layers.

Next, components of the second filter 22 will be described. The inductor L23 is constituted by the conductor layers 692, 702, 712, 722, 732, and 742. The inductor L24 is constituted by the conductor layers 592, 602, 612, 622, 632, 642, 652, and 662. The inductor L25 is constituted by the conductor layers 613, 623, 633, 643, 653, and 663.

The capacitor C23 is composed of the conductor layers 761 and 771 and the dielectric layer 76 interposed between those conductor layers. The capacitor C24 is composed of the conductor layers 761 and 772 and the dielectric layer 76 interposed between those conductor layers. The capacitor C25 is composed of the conductor layers 762 and 772 and the dielectric layer 76 interposed between those conductor layers. The capacitor C26 is composed of the conductor layers 763 and 773 and the dielectric layer 76 interposed between those conductor layers.

Next, components of the third filter 31 will be described. The inductor L31 is constituted by the conductor layers 693, 703, 713, 723, 733, and 743. The inductor L32 is constituted by the conductor layers 594, 604, 614, and 624.

The capacitor C31 is composed of the conductor layers 532, 542, 552, and 561 and the dielectric layers 53, 54, and 55 interposed between each two of those conductor layers. The capacitor C32 is composed of the conductor layers 533, 542, 561, and 571 and the dielectric layers 53 and 56 each interposed between each two of those conductor layers.

Next, components of the fourth filter 32 will be described. The inductor L33 is constituted by the conductor layers 595, 605, 615, and 625. The inductor L34 is constituted by the conductor layers 674, 684, 694, 704, 714, 724, 734, and 744.

The capacitor C33 is composed of the conductor layers 553 and 562 and the dielectric layer 55 interposed between those conductor layers. The capacitor C34 is composed of the conductor layers 534, 543, and 553 and the dielectric layers 53 and 54 interposed between each two of those conductor layers. The capacitor C35 is composed of the conductor layers 535 and 543 and the dielectric layer 53 interposed between those conductor layers.

Next, components of the fifth filter 41 will be described. The inductor L41 is constituted by the conductor layers 715, 725, 735, and 745. The inductor L42 is constituted by the conductor layers 736 and 746, a plurality of through holes connected in series to connect the conductor layer 554 and the conductor layer 736, and a plurality of through holes connected in series to connect the conductor layer 544 and the conductor layer 736.

The capacitor C41 is composed of the conductor layers 536 and 544 and the dielectric layer 53 interposed between those conductor layers. The capacitor C42 is composed of the conductor layers 544 and 554 and the dielectric layer 54 interposed between those conductor layers.

Next, components of the sixth filter 42 will be described. The inductor L43 is constituted by the conductor layers 675, 685, 695, and 705.

The capacitor C43 is composed of the conductor layers 752 and 764 and the dielectric layer 75 interposed between those conductor layers. The capacitor C44 is composed of the conductor layers 753 and 764 and the dielectric layer 75 interposed between those conductor layers. The capacitor C45 is composed of the conductor layers 754 and 765 and the dielectric layer 75 interposed between those conductor layers.

The inductor L44 is constituted by the conductor layers 634 and 644, a plurality of through holes connected in series to connect the conductor layer 586 and the conductor layer 634, and a plurality of through holes connected in series to connect the conductor layer 546 and the conductor layer 634. The inductor L45 is constituted by the conductor layer 525.

The capacitor C46 is composed of the conductor layers 537 and 545 and the dielectric layer 53 interposed between those conductor layers. The capacitor C47 is composed of the conductor layers 538 and 546 and the dielectric layer 53 interposed between those conductor layers. The capacitor C48 is composed of the conductor layers 546 and 555 and the dielectric layer 54 interposed between those conductor layers.

Now, the operation and effects of the branching filter 1 according to the present embodiment will be described. The branching filter 1 according to the present embodiment includes the first to third diplexers 20, 30, and 40 connected as described above. Thus, according to the present embodiment, it is possible to reduce insertion loss in each of the first to fourth passbands. The effects will be described below in comparison with branching filters of first and second comparative examples.

Figure 15:
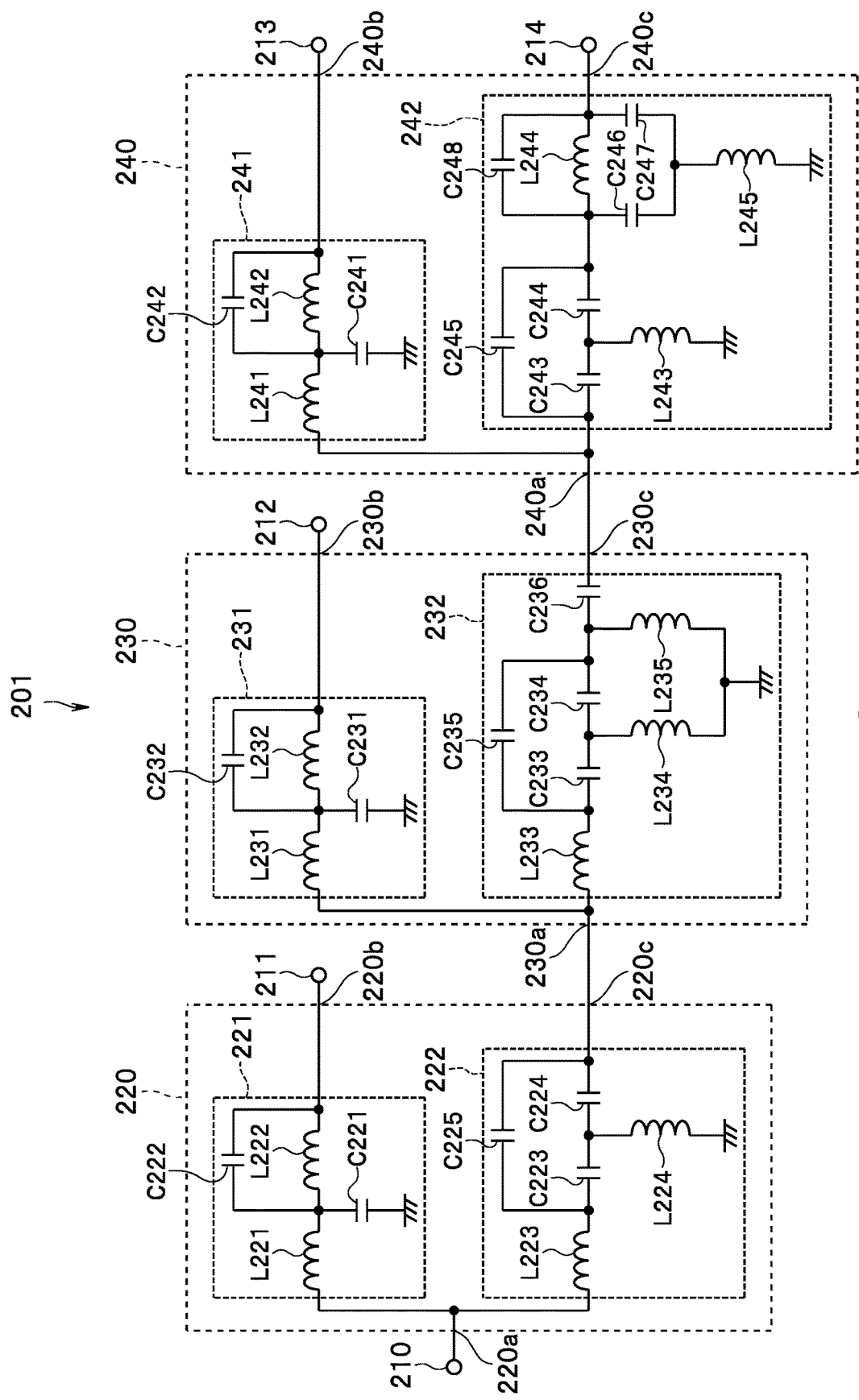
FIG. 15 is a circuit diagram showing a circuit configuration of a branching filter according to a first comparative example.

First, a configuration of a branching filter 201 of the first comparative example will be described with reference to FIG. 15. FIG. 15 is a circuit diagram showing a circuit configuration of the branching filter 201 of the first comparative example. The branching filter 201 of the first comparative example, similarly to the branching filter 1 according to the present embodiment, is configured to separate a first signal of a frequency within a first passband, a second signal of a frequency within a second passband, a third signal of a frequency within a third passband, and a fourth signal of a frequency within a fourth passband. In other words, the branching filter 201 of the first comparative example includes an input port 210, a first output port 211, a second output port 212, a third output port 213, and a fourth output port 214. The functions of the input port 210 and the first to fourth output ports 211 to 214 are the same as the functions of the input port 10 and the first to fourth output ports 11 to 14 in the present embodiment.

The branching filter 201 further includes a first diplexer 220, a second diplexer 230, and a third diplexer 240. The first diplexer 220 includes an input end 220a and two output ends 220b and 220c. The input end 220a of the first diplexer 220 is connected to the input port 210. The output end 220b of the first diplexer 220 is connected to the first output port 211.

The second diplexer 230 includes an input end 230a and two output ends 230b and 230c. The input end 230a of the second diplexer 230 is connected to the output end 220c of the first diplexer 220. The output end 230b of the second diplexer 230 is connected to the second output port 212.

The third diplexer 240 includes an input end 240a and two output ends 240b and 240c. The input end 240a of the third diplexer 240 is connected to the output end 230c of the second diplexer 230. The output end 240b of the third diplexer 240 is connected to the third output port 213. The output end 240c of the third diplexer 240 is connected to the fourth output port 214.

The first diplexer 220 includes a first filter 221 provided between the input end 220a and the output end 220b in circuit configuration and a second filter 222 provided between the input end 220a and the output end 220c in circuit configuration. The first filter 221 is a filter configured to selectively pass a signal of a frequency within the first passband. The second filter 22 is a filter configured to selectively pass a signal of a frequency band including the second to fourth passbands but not including the first passband.

The second diplexer 230 includes a third filter 231 provided between the input end 230a and the output end 230b in circuit configuration and a fourth filter 232 provided between the input end 230a and the output end 230c in circuit configuration. The third filter 231 is a filter configured to selectively pass a signal of a frequency within the second passband. The fourth filter 232 is a filter configured to selectively pass a signal of a frequency band including the third and fourth passbands but not including the second passband.

The third diplexer 240 includes a fifth filter 241 provided between the input end 240a and the output end 240b in circuit configuration and a sixth filter 242 provided between the input end 240a and the output end 240c in circuit configuration. The fifth filter 241 is a filter configured to selectively pass a signal of a frequency within the third passband. The sixth filter 242 is a filter configured to selectively pass a signal of a frequency within the fourth passband.

Concrete circuit configurations of the first and second filters 221 and 222 of the first diplexer 220 are similar to the circuit configurations of the third and fourth filters 31 and 32 of the second diplexer 30 of the present embodiment. By replacing the input end 30a, the output ends 30b and 30c, the inductors L31, L32, L33, and L34, and the capacitors C31, C32, C33, C34, and C35 in the description of the circuit configurations of the third and fourth filters 31 and 32 with the input end 220a, the output ends 220b and 220c, the inductors L221, L222, L223, and L224, and the capacitors C221, C222, C223, C224, and C225, respectively, the description serves as the replaced description of the circuit configurations of the first and second filters 221 and 222.

Concrete circuit configurations of the third and fourth filters 231 and 232 of the second diplexer 230 are similar to the circuit configurations of the first and second filters 21 and 22 of the first diplexer 20 of the present embodiment. By replacing the input end 20a, the output ends 20b and 20c, the inductors L21, L22, L23, L24, and L25, and the capacitors C21, C22, C23, C24, C25, and C26 in the description of the circuit configurations of the first and second filters 21 and 22 with the input end 230a, the output ends 230b and 230c, the inductors L231, L232, L233, L234, and L235, and the capacitors C231, C232, C233, C234, C235, and C236, respectively, the replaced description serves as the description of the circuit configurations of the third and fourth filters 231 and 232.

Concrete circuit configurations of the fifth and sixth filters 241 and 242 of the third diplexer 240 are similar to the circuit configurations of the fifth and sixth filters 41 and 42 of the third diplexer 40 of the present embodiment. By replacing the input end 40a, the output ends 40b and 40c, the inductors L41, L42, L43, L44, and L45, and the capacitors C41, C42, C43, C44, C45, C46, C47, and C48 in the description of the circuit configurations of the fifth and sixth filters 41 and 42 with the input end 240a, the output ends 240b and 240c, the inductors L241, L242, L243, L244, and L245, and the capacitors C241, C242, C243, C244, C245, C246, C247, and C248, respectively, the description serves as the replaced description of the circuit configurations of the fifth and sixth filters 241 and 242.

Figure 16:
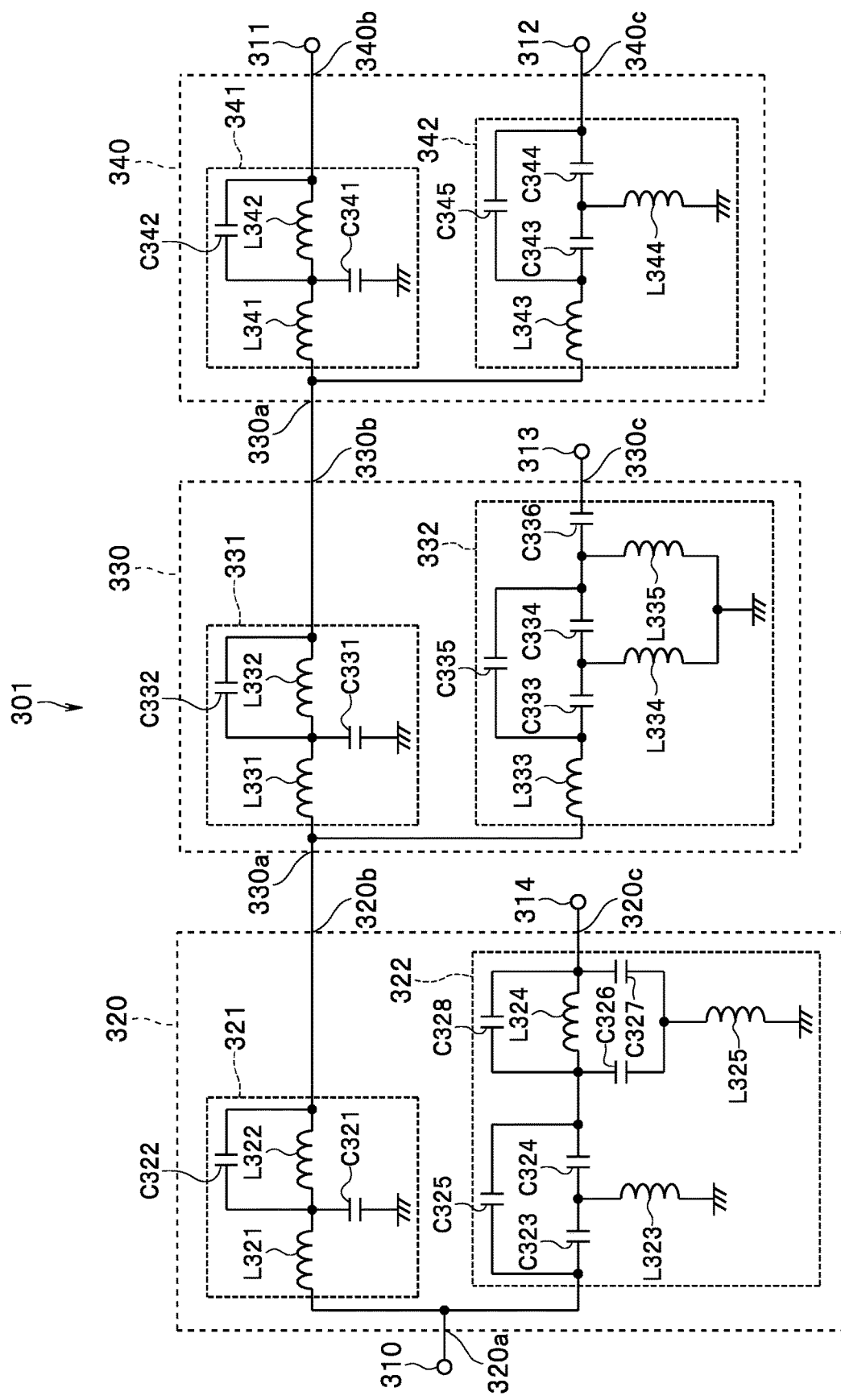
FIG. 16 is a circuit diagram showing a circuit configuration of a branching filter according to a second comparative example.

Next, a configuration of a branching filter 301 of the second comparative example will be described with reference to FIG. 16. FIG. 16 is a circuit diagram showing a circuit configuration of the branching filter 301 of the second comparative example. The branching filter 301 of the second comparative example, similarly to the branching filter 1 according to the present embodiment, is configured to separate a first signal of a frequency within a first passband, a second signal of a frequency within a second passband, a third signal of a frequency within a third passband, and a fourth signal of a frequency within a fourth passband. In other words, the branching filter 301 of the second comparative example includes an input port 310, a first output port 311, a second output port 312, a third output port 313, and a fourth output port 314. The functions of the input port 310 and the first to fourth output ports 311 to 314 are the same as the functions of the input port 10 and the first to fourth output ports 11 to 14 in the present embodiment.

The branching filter 301 further includes a first diplexer 320, a second diplexer 330, and the third diplexer 340. The first diplexer 320 includes an input end 320a and two output ends 320b and 320c. The input end 320a of the first diplexer 320 is connected to the input port 310. The output end 320c of the first diplexer 320 is connected to the fourth output port 314.

The second diplexer 330 includes an input end 330a and two output ends 330b and 330c. The input end 330a of the second diplexer 330 is connected to the output end 320b of the first diplexer 320. The output end 330c of the second diplexer 330 is connected to the third output port 313.

The third diplexer 340 includes an input end 340a and two output ends 340b and 340c. The input end 340a of the third diplexer 340 is connected to the output end 330b of the second diplexer 330. The output end 340b of the third diplexer 340 is connected to the first output port 311. The output end 340c of the third diplexer 340 is connected to the second output port 312.

The first diplexer 320 includes a first filter 321 provided between the input end 320a and the output end 320b in circuit configuration and a second filter 322 provided between the input end 320a and the output end 320c in circuit configuration. The first filter 321 is a filter configured to selectively pass a signal of a frequency band including the first to third passbands but not including the fourth passband. The second filter 322 is a filter configured to selectively pass a signal of a frequency within the fourth passband.

The second diplexer 330 includes a third filter 331 provided between the input end 330a and the output end 330b in circuit configuration and a fourth filter 332 provided between the input end 330a and the output end 330c in circuit configuration. The third filter 331 is a filter configured to selectively pass a signal of a frequency band including the first and second passbands but not including the third passband. The fourth filter 332 is a filter configured to selectively pass a signal of a frequency within the third passband.

The third diplexer 340 includes a fifth filter 341 provided between the input end 340a and the output end 340b in circuit configuration and a sixth filter 342 provided between the input end 340a and the output end 340c in circuit configuration. The fifth filter 341 is a filter configured to selectively pass a signal of a frequency within the first passband. The sixth filter 342 is a filter configured to selectively pass a signal of a frequency within the second passband.

Concrete circuit configurations of the first and second filters 321 and 322 of the first diplexer 320 are similar to the circuit configurations of the fifth and sixth filters 41 and 42 of the third diplexer 40 of the present embodiment. By replacing the input end 40a, the output ends 40b and 40c, the inductors L41, L42, L43, L44, and L45, and the capacitors C41, C42, C43, C44, C45, C46, C47, and C48 in the description of the circuit configurations of the fifth and sixth filters 41 and 42 with the input end 320a, the output ends 320b and 320c, the inductors L321, L322, L323, L324, and L325, and the capacitors C321, C322, C323, C324, C325, C326, C327, and C328, respectively, the replaced description serves as the description of the circuit configurations of the first and second filters 321 and 322.

Concrete circuit configurations of the third and fourth filters 331 and 332 of the second diplexer 330 are similar to the circuit configurations of the first and second filters 21 and 22 of the first diplexer 20 of the present embodiment. By replacing the input end 20a, the output ends 20b and 20c, the inductors L21, L22, L23, L24, and L25, and the capacitors C21, C22, C23, C24, C25, and C26 in the description of the circuit configurations of the first and second filters 21 and 22 with the input end 330a, the output ends 330b and 330c, the inductors L331, L332, L333, L334, and L335, and the capacitors C331, C332, C333, C334, C335, and C336, respectively, the replaced description serves as the description of the circuit configurations of the third and fourth filters 331 and 332.

Concrete circuit configurations of the fifth and sixth filters 341 and 342 of the third diplexer 340 are similar to the circuit configurations of the third and fourth filters 31 and 32 of the second diplexer 30 of the present embodiment. By replacing the input end 30a, the output ends 30b and 30c, the inductors L31, L32, L33, and L34, and the capacitors C31, C32, C33, C34, and C35 in the description of the circuit configurations of the third and fourth filters 31 and 32 with the input end 340a, the output ends 340b and 340c, the inductors L341, L342, L343, and L344, and the capacitors C341, C342, C343, C344, and C345, respectively, the replaced description serves as the description of the circuit configurations of the fifth and sixth filters 341 and 342.

Next, results of a simulation of comparing pass attenuation characteristics of the branching filter 1 according to the present embodiment and pass attenuation characteristics of the branching filters 201 and 301 of the first and second comparative examples will be described. In this simulation, a model of a practical example, a model of the first comparative example, and a model of the second comparative example were used. The model of the practical example is a model of the branching filter 1 according to the present embodiment having the circuit configuration shown in FIG.

2. The model of the first comparative example is a model of the branching filter 201 of the first comparative example. The model of the second comparative example is a model of the branching filter 301 of the second comparative example. In this simulation, pass attenuation characteristics between the input port and each of the first to fourth output ports were obtained for each of the model of the practical example, the model of the first comparative example, and the model of the second comparative example.

Figure 17:
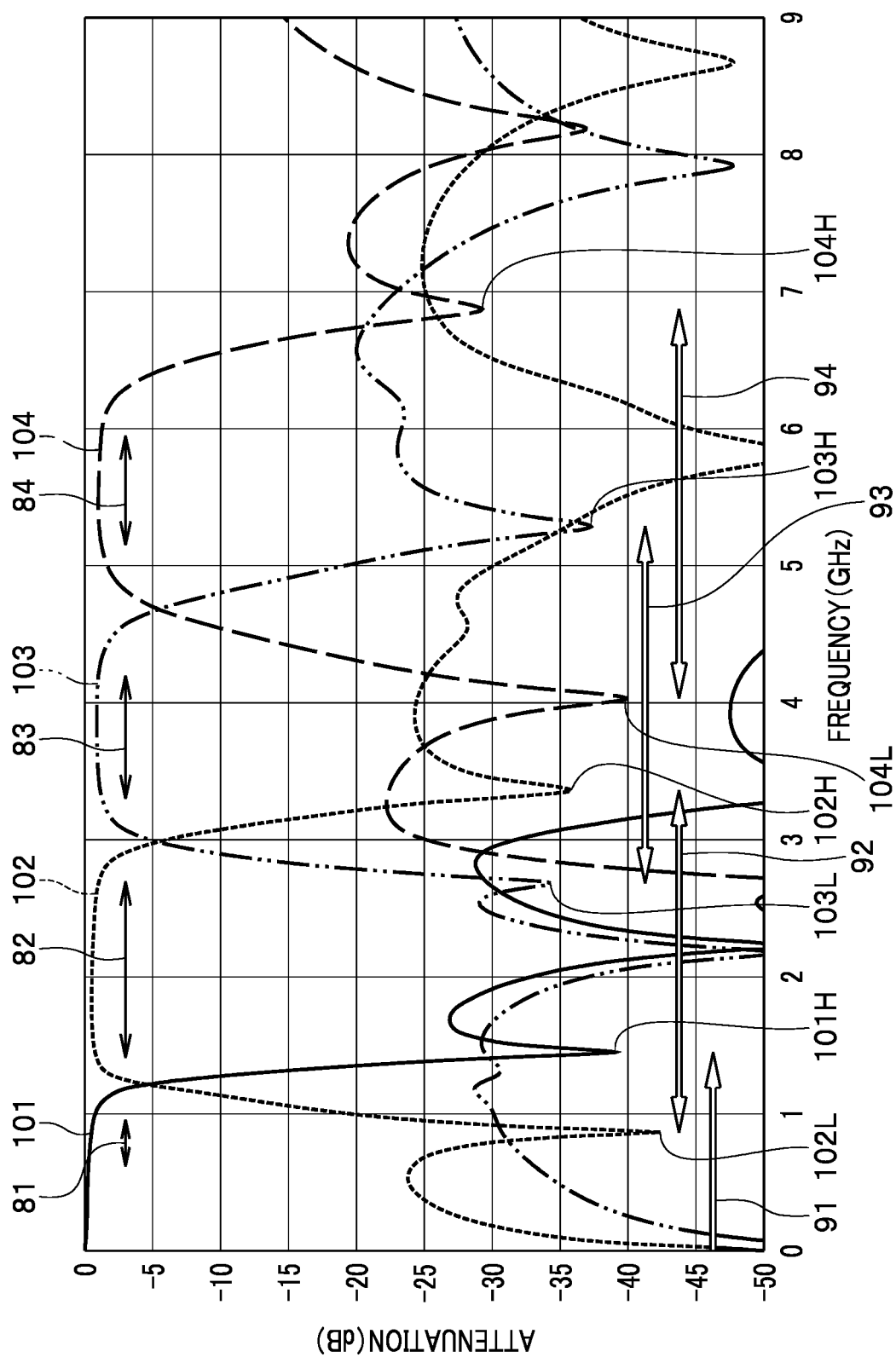
FIG. 17 is a characteristic chart showing pass attenuation characteristics of a model of a practical example.
Figure 18:
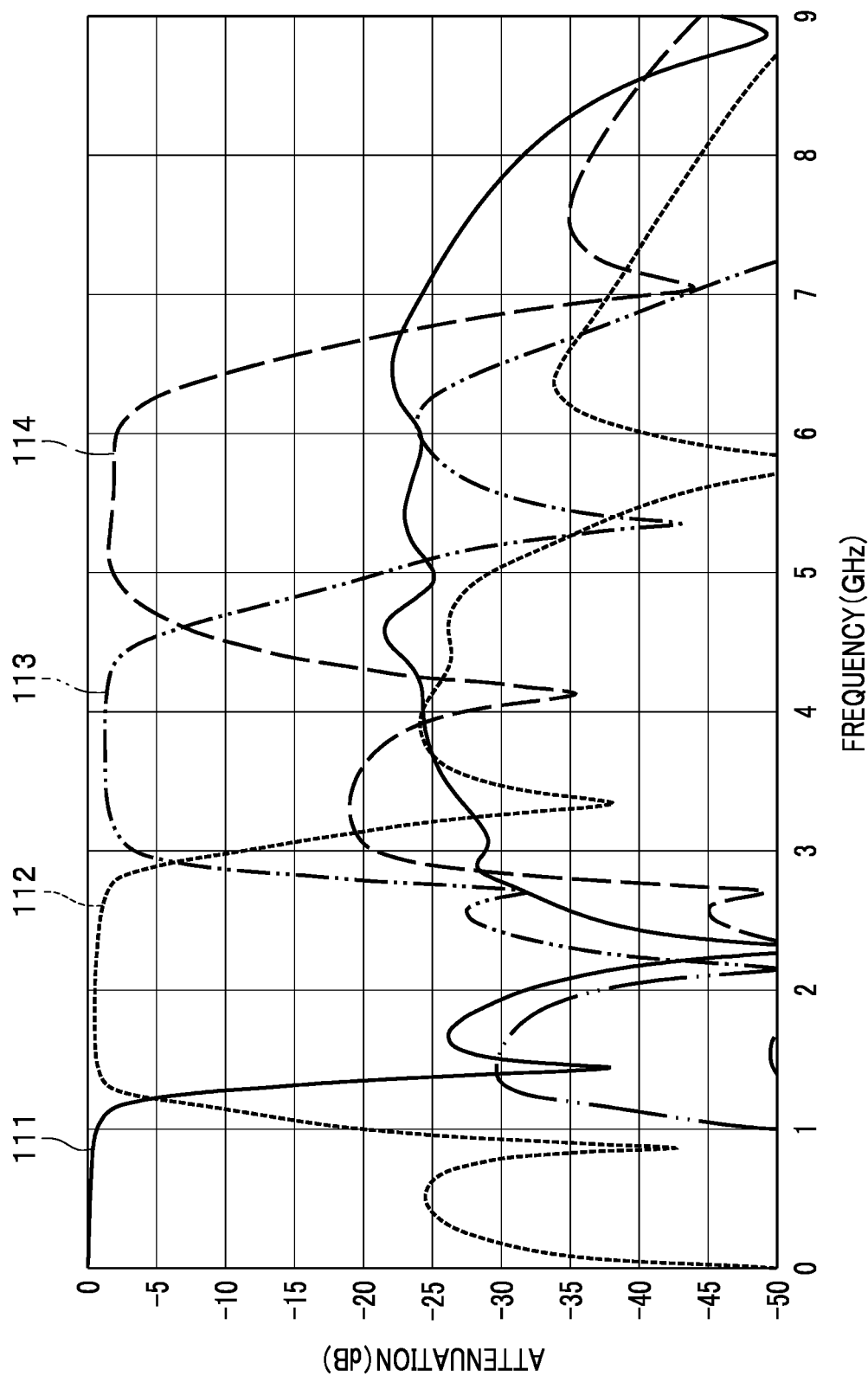
FIG. 18 is a characteristic chart showing pass attenuation characteristics of a model of the first comparative example.
Figure 19:
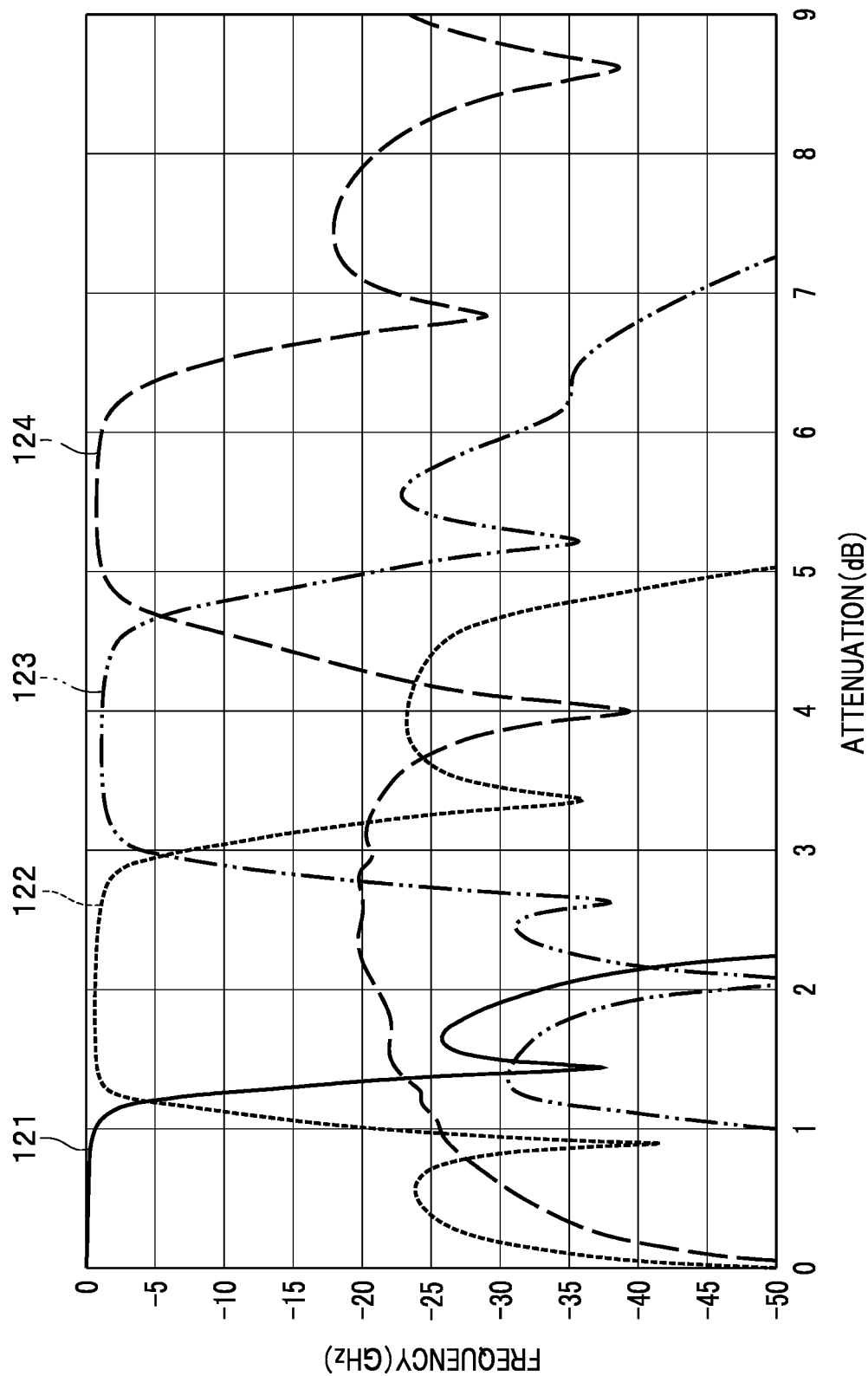
FIG. 19 is a characteristic chart showing pass attenuation characteristics of a model of the second comparative example.

FIG. 17 is a characteristic chart showing pass attenuation characteristics of the model of the practical example. FIG. 18 is a characteristic chart showing pass attenuation characteristics of the model of the first comparative example. FIG. 19 is a characteristic chart showing pass attenuation characteristics of the model of the second comparative example. In FIG. 17 to FIG. 19, the horizontal axis indicates frequency, and the vertical axis indicates the attenuation.

In FIG. 17, a reference numeral 101 indicates the pass attenuation characteristics between the input port 10 and the first output port 11. A reference numeral 102 indicates the pass attenuation characteristics between the input port 10 and the second output port 12. A reference numeral 103 indicates the pass attenuation characteristics between the input port 10 and the third output port 13. A reference numeral 104 indicates the pass attenuation characteristics between the input port 10 and the fourth output port 14.

In FIG. 18, a reference numeral 111 indicates the pass attenuation characteristics between the input port 210 and the first output port 211. A reference numeral 112 indicates the pass attenuation characteristics between the input port 210 and the second output port 212. A reference numeral 113 indicates the pass attenuation characteristics between the input port 210 and the third output port 213. A reference numeral 114 indicates the pass attenuation characteristics between the input port 210 and the fourth output port 214.

In FIG. 19, a reference numeral 121 indicates the pass attenuation characteristics between the input port 310 and the first output port 311. A reference numeral 122 indicates the pass attenuation characteristics between the input port 310 and the second output port 312. A reference numeral 123 indicates the pass attenuation characteristics between the input port 310 and the third output port 313. A reference numeral 124 indicates the pass attenuation characteristics between the input port 310 and the fourth output port 314.

In FIG. 17, an arrow denoted by a reference numeral 81 schematically shows the first passband of the branching filter 1. An arrow denoted by a reference numeral 82 schematically shows the second passband of the branching filter 1. An arrow denoted by a reference numeral 83 schematically shows the third passband of the branching filter 1. An arrow denoted by a reference numeral 84 schematically shows the fourth passband of the branching filter 1. Note that the first to fourth pas sbands of the branching filter 201 of the first comparative example and the first to fourth passbands of the branching filter 301 of the second comparative example are the same as the first to fourth passbands of the branching filter 1, although not shown.

In the model of the practical example, the attenuation at the upper limit frequency of the first passband was −0.62 dB. The attenuation at the lower limit frequency of the second passband was −0.87 dB, and the attenuation at the upper frequency of the second passband was −1.02 dB. The attenuation at the lower frequency of the third passband was −1.27 dB, and the attenuation at the upper limit frequency of the third passband was −1.05 dB. The attenuation at the lower frequency of the fourth passband was −1.25 dB, and the attenuation at the upper limit frequency of the fourth passband was −1.24 dB. In the model of the practical example, the amount of insertion loss (absolute value of the attenuation) in each of the first to fourth passbands was a sufficiently small value.

In the model of the first comparative example, the attenuation at the upper limit frequency of the first passband was −0.52 dB. The attenuation at the lower limit frequency of the second passband was −0.87 dB, and the attenuation at the upper limit frequency of the second passband was −1.29 dB. The attenuation at the lower limit frequency of the third passband was −1.49 dB, and the attenuation at the upper limit frequency of the third passband was −1.44 dB. The attenuation at the lower limit frequency of the fourth passband was −1.51 dB, and the attenuation at the upper limit frequency of the fourth passband was −2.00 dB. In the model of the first comparative example, the amount of insertion loss in each of the first to third passbands was a sufficiently small value. However, in the model of the first comparative example, the amount of insertion loss in the fourth passband was larger than that of the model of the practical example.

In the model of the second comparative example, the attenuation at the upper limit frequency of the first passband was −0.58 dB. The attenuation at the lower limit frequency of the second passband was −0.89 dB, and the attenuation at the upper limit frequency of the second passband was −1.30 dB. The attenuation at the lower limit frequency of the third passband was −1.45 dB, and the attenuation at the upper limit frequency of the third passband was −1.35 dB. The attenuation at the lower limit frequency of the fourth passband was −0.92 dB, and the attenuation at the upper limit frequency of the fourth passband was −1.04 dB. In the model of the second comparative example, the amount of insertion loss in each of the first, third, and fourth passbands was a sufficiently small value. However, in the model of the second comparative example, the amount of insertion loss in the second passband was larger than that of the model of the practical example.

As understood from the results of the simulation, according to the present embodiment, it is possible to reduce insertion loss in all of the first to fourth passbands.

In the branching filter 201 of the first comparative example, the second, fourth, and sixth filters 222, 232, and 243 are provided between the input port 210 and the fourth output port 214. In the branching filter 301 of the second comparative example, the first, third, and sixth filters 321, 331, and 342 are provided between the input port 310 and the second output port 312. In general, as the number of filters increases, the number of elements also increases, which consequently increases insertion loss.

In contrast to this, in the present embodiment, the number of filters provided on each of the first to fourth paths P1 to P4 is two. In other words, in the present embodiment, by preventing an increase of the number of filters provided on a specific path, this can prevent an increase of the number of elements provided on the specific path.

Now, other features of the branching filter 1 according to the present embodiment will be described. First, the first feature will be described. As shown in FIG. 1 and FIG. 2, in the branching filter 1, a first filter group constituted of the first and third filters 21 and 31 is provided between the input port 10 and the first output port 11. Moreover, a second filter group constituted of the first and fourth filters 21 and 32 is provided between the input port 10 and the second output port 12. A third filter group constituted of the second and fifth filters 22 and 41 is provided between the input port 10 and the third output port 13. A fourth filter group constituted of the second and sixth filters 22 and 42 is provided between the input port 10 and the fourth output port 14.

The number of stages of the first filer group is eight, the number of stages of the second filter group is eight, the number of stages of the third filter group is 11, and the number of stages of the fourth filter group is 13. In the present embodiment, the difference between the number of stages of the fourth filter group having the largest number of stages and the number of stages of the first filter group or the second filter group having the smallest number of stages is five.

Next, the second feature will be described. In the present embodiment, each of the first to third diplexers 20, 30, and 40 is an LC circuit including a plurality of inductors and a plurality of capacitors.

Next, the third feature will be described. In FIG. 17, a reference numeral 101H indicates an attenuation pole formed on a high frequency side of the first passband 81 and being closest to the first passband 81. A reference numeral 102L indicates an attenuation pole formed on a low frequency side of the second passband 82 and being closest to the second passband 82. A reference numeral 102H indicates an attenuation pole formed on a high frequency side of the second passband 82 and being closest to the second passband 82. A reference numeral 103L indicates an attenuation pole formed on a low frequency side of the third passband 83 and being closest to the third passband 83. A reference numeral 103H indicates an attenuation pole formed on a high frequency side of the third passband 83 and being closest to the third passband 83. A reference numeral 104L indicates an attenuation pole formed on a low frequency side of the fourth passband 84 and being closest to the fourth passband 84. A reference numeral 104H indicates an attenuation pole formed on a high frequency side of the fourth passband 84 and being closest to the fourth passband 84.

In FIG. 17, an arrow denoted by a reference numeral 91 schematically shows a first band being a frequency band including the first passband 81 and also having an upper limit at the attenuation pole 101H. The first band 91 is included in the pass attenuation characteristics between the input port 10 and the first output port 11.

An arrow denoted by a reference numeral 92 schematically shows a second band being a frequency band including the second passband 82 and also having a lower limit at the attenuation pole 102L while having an upper limit at the attenuation pole 102H. The second band 92 is included in the pass attenuation characteristics between the input port 10 and the second output port 12.

An arrow denoted by a reference numeral 93 schematically shows a third band being a frequency band including the third passband 83 and also having a lower limit at the attenuation pole 103L while having an upper limit at the attenuation pole 103H. The third band 93 is included in the pass attenuation characteristics between the input port 10 and the third output port 13.

An arrow denoted by a reference numeral 94 schematically shows a fourth band being a frequency band including the fourth passband 84 and also having a lower limit at the attenuation pole 104L while having an upper limit at the attenuation pole 104H. The fourth band 94 is included in the pass attenuation characteristics between the input port 10 and the fourth output port 14.

The second band 92 overlaps the first and third bands 91 and 93. Specifically, the second band 92 includes a frequency band also included in the first band 91 and a frequency band also included in the third band 93. This feature indicates that the second passband 82 is a frequency band close to each of the first passband 81 and the third passband 83.

The third band 93 overlaps the second and fourth bands 92 and 94. Specifically, the third band 93 includes a frequency band also included in the second band 92 and a frequency band also included in the fourth band 94. This feature indicates that the third passband 83 is a frequency band close to each of the second passband 82 and the third passband 83.

The third feature indicates that the branching filter 1 is configured to separate signals of frequency bands relatively close to each other.

The present invention is not limited to the foregoing embodiment, and various modifications may be made thereto. For example, each of the first to third diplexers 20, 30, and 40 has any circuit configuration as long as the requirements of the claims are satisfied.

As described above, a branching filter of the present invention includes:
an input port;
a first output port;
a second output port;
a third output port;
a fourth output port;
a first diplexer including a first input end connected to the input port, a first output end, and a second output end;
a second diplexer including a second input end connected to the first output end, a third output end directly connected to the first output port, and a fourth output end directly connected to the second output port; and
a third diplexer including a third input end connected to the second output end, a fifth output end directly connected to the third output port, and a sixth output end directly connected to the fourth output port.

In the branching filter of the present invention, the first output port may be a port that selectively passes a signal of a frequency within a first passband. The second output port may be a port that selectively passes a signal of a frequency within a second passband higher than the first passband. The third output port may be a port that selectively passes a signal of a frequency within a third passband. The fourth output port may be a port that selectively passes a signal of a frequency within a fourth passband higher than the third passband. The first diplexer may be configured to selectively pass a signal of a frequency band including the second passband but not including the third passband through the first output end and selectively pass a signal of a frequency band including the third passband but not including the second passband through the second output end. The third passband may be a frequency band higher than the second passband.

In the branching filter of the present invention, the second diplexer may be configured to selectively pass a signal of a frequency within the first passband through the third output end and selectively pass a signal of a frequency within the second passband higher than the first passband through the fourth output end. The third diplexer may be configured to selectively pass a signal of a frequency within the third passband through the fifth output end and selectively pass a signal of a frequency within the fourth passband higher than the third passband through the sixth output end. The first diplexer may be configured to selectively pass a signal of a frequency band including the second passband but not including the third passband through the first output end and selectively pass a signal of a frequency band including the third passband but not including the second passband through the second output end. The third passband may be a frequency band higher than the second passband.

In the branching filter of the present invention, the first output port may be a port that selectively passes a signal of a frequency within the first passband, the second output port may be a port that selectively passes a signal of a frequency within the second passband higher than the first passband, the third output port may be a port that selectively passes a signal of a frequency within the third passband higher than the second passband, and the fourth output port may be a port that selectively passes a signal of a frequency within the fourth passband higher than the third passband. In this case, pass attenuation characteristics between the input port and the first output port may include a first band being a frequency band including the first passband and having an upper limit at a first attenuation pole formed on a high frequency side of the first passband and being closest to the first passband. Pass attenuation characteristics between the input port and the second output port may include a second band being a frequency band including the second passband and having a lower limit at a second attenuation pole formed on a low frequency side of the second passband and being closest to the second passband while having an upper limit at a third attenuation pole formed on a high frequency side of the second passband and being closest to the second passband. Pass attenuation characteristics between the input port and the third output port may include a third band being a frequency band including the third passband and having a lower limit at a fourth attenuation pole formed on a low frequency side of the third passband and being closest to the third passband while having an upper limit at a fifth attenuation pole formed on a high frequency side of the third passband and being closest to the third passband. Pass attenuation characteristics between the input port and the fourth output port may include a fourth band being a frequency band including the fourth passband and having a lower limit at a sixth attenuation pole formed on a low frequency side of the fourth passband and being closest to the fourth passband. The second band may include a frequency band also included in the first band and a frequency band also included in the third band. The third band may include a frequency band also included in the second band and a frequency band also included in the fourth band.

In the branching filter of the present invention, a first filter may be formed between the input port and the first output port, a second filter may be formed between the input port and the second output port, a third filter may be formed between the input port and the third output port, and a fourth filter may be formed between the input port and the fourth output port. In this case, when a filter with a largest number of stages is used as a first specific filter and a filter with a smallest number of stages is used as a second specific filter, among the first filter, the second filter, the third filter, and the fourth filter, the difference between the number of stages of the first specific filter and the number of stages of the second specific filter may be five.

In the branching filter of the present invention, each of the first diplexer, the second diplexer, and the third diplexer may be an LC circuit including a plurality of inductors and a plurality of capacitors.

Obviously, various modifications and variations of the present invention are possible in the light of the above teachings. Thus, it is to be understood that, within the scope of the appended claims and equivalents thereof, the present invention may be practiced in other embodiments than the foregoing most preferable embodiment.

What is claimed is:

1. A branching filter comprising:
an input port;
a first output port;
a second output port;
a third output port;
a fourth output port;
a first diplexer including a first input end connected to the input port, a first output end, and a second output end;
a second diplexer including a second input end directly connected to the first output end, a third output end directly connected to the first output port, and a fourth output end directly connected to the second output port; and
a third diplexer including a third input end directly connected to the second output end, a fifth output end directly connected to the third output port, and a sixth output end directly connected to the fourth output port, wherein
the first output port is a port that selectively passes a signal of a frequency within a first passband toward an outside of the branching filter,
the second output port is a port that selectively passes a signal of a frequency within a second passband higher than the first passband toward the outside of the branching filter,
the third output port is a port that selectively passes a signal of a frequency within a third passband higher than the second passband toward the outside of the branching filter, and
the fourth output port is a port that selectively passes a signal of a frequency within a fourth passband higher than the third passband toward the outside of the branching filter.

2. The branching filter according to claim 1, wherein the first diplexer is configured to selectively pass a signal of a frequency band including the second passband but not including the third passband through the first output end and selectively pass a signal of a frequency band including the third passband but not including the second passband through the second output end.

3. The branching filter according to claim 2, wherein the third passband is a frequency band higher than the second passband.

4. The branching filter according to claim 1, wherein
the second diplexer is configured to selectively pass a signal of a frequency within the first passband through the third output end and selectively pass a signal of a frequency within the second passband higher than the first passband through the fourth output end,
the third diplexer is configured to selectively pass a signal of a frequency within the third passband through the fifth output end and selectively pass a signal of a frequency within the fourth passband higher than the third passband through the sixth output end, and
the first diplexer is configured to selectively pass a signal of a frequency band including the second passband but not including the third passband through the first output end and selectively pass a signal of a frequency band including the third passband but not including the second passband through the second output end.

5. The branching filter according to claim 4, wherein the third passband is a frequency band higher than the second passband.

6. The branching filter according to claim 1, wherein pass attenuation characteristics between the input port and the first output port include a first band being a frequency band including the first passband and having an upper limit at a first attenuation pole formed on a high frequency side of the first passband and being closest to the first passband, pass attenuation characteristics between the input port and the second output port include a second band being a frequency band including the second passband and having a lower limit at a second attenuation pole formed on a low frequency side of the second passband and being closest to the second passband while having an upper limit at a third attenuation pole formed on a high frequency side of the second passband and being closest to the second passband, pass attenuation characteristics between the input port and the third output port include a third band being a frequency band including the third passband and having a lower limit at a fourth attenuation pole formed on a low frequency side of the third passband and being closest to the third passband while having an upper limit at a fifth attenuation pole formed on a high frequency side of the third passband and being closest to the third passband, and pass attenuation characteristics between the input port and the fourth output port include a fourth band being a frequency band including the fourth passband and having a lower limit at a sixth attenuation pole formed on a low frequency side of the fourth passband and being closest to the fourth passband.

7. The branching filter according to claim 6, wherein the second band includes a frequency band also included in the first band and a frequency band also included in the third band, and the third band includes a frequency band also included in the second band and a frequency band also included in the fourth band.

8. The branching filter according to claim 1, wherein each of the first diplexer, the second diplexer, and the third diplexer is an LC circuit including a plurality of inductors and a plurality of capacitors.

9. A branching filter comprising:

an input port;

a first output port;

a second output port;

a third output port;

a fourth output port;

a first diplexer including a first input end connected to the input port, a first output end, and a second output end;

a second diplexer including a second input end connected to the first output end, a third output end directly connected to the first output port, and a fourth output end directly connected to the second output port; and a third diplexer including a third input end connected to the second output end, a fifth output end directly connected to the third output port, and a sixth output end directly connected to the fourth output port, wherein a first filter is formed between the input port and the first output port, a second filter is formed between the input port and the second output port, a third filter is formed between the input port and the third output port, a fourth filter is formed between the input port and the fourth output port, and when a filter with a largest number of stages is used as a first specific filter and a filter with a smallest number of stages is used as a second specific filter, among the first filter, the second filter, the third filter, and the fourth filter, a difference between the number of stages of the first specific filter and the number of stages of the second specific filter is five.

\* \* \* \* \*